(12) United States Patent
Fuse

(10) Patent No.: US 12,482,650 B2
(45) Date of Patent: Nov. 25, 2025

(54) FILM FORMATION METHOD

(71) Applicant: Tokyo Electron Limited, Tokyo (JP)

(72) Inventor: Takashi Fuse, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 617 days.

(21) Appl. No.: 17/760,145

(22) PCT Filed: Feb. 1, 2021

(86) PCT No.: PCT/JP2021/003467
§ 371 (c)(1),
(2) Date: Aug. 4, 2022

(87) PCT Pub. No.: WO2021/161830
PCT Pub. Date: Aug. 19, 2021

(65) Prior Publication Data
US 2023/0072570 A1    Mar. 9, 2023

(30) Foreign Application Priority Data

Feb. 14, 2020    (JP) ................................ 2020-023765

(51) Int. Cl.
*H01L 21/02*    (2006.01)
(52) U.S. Cl.
CPC .... *H01L 21/0228* (2013.01); *H01L 21/02211* (2013.01)
(58) Field of Classification Search
None
See application file for complete search history.

(56) References Cited

U.S. PATENT DOCUMENTS 9,982,156 B1 * 5/2018 Lohmeier .............. G02B 1/113

FOREIGN PATENT DOCUMENTS

| JP | H11-112062 A | 4/1999 |
| JP | 2001-064664 A | 3/2001 |
| JP | 2005-053116 A | 3/2005 |
| JP | 2007-145984 A | 6/2007 |
| WO | 2009041365 A1 | 4/2009 |

* cited by examiner

*Primary Examiner* — Asok K Sarkar
(74) *Attorney, Agent, or Firm* — Armstrong Teasdale LLP

(57) ABSTRACT

A film formation method includes: a step of preparing a substrate including a layer of a first material formed on a surface in a first region, and a layer of a second material formed on a surface in a second region; a first SAM formation step of forming a first self-assembled monolayer in the first region by supplying a raw material gas for the first self-assembled monolayer, wherein the raw material gas corresponds to the first material; and a second SAM formation step for forming a second self-assembled monolayer including an organic acid group or a second self-assembled monolayer including a condensable group on top of the first self-assembled monolayer in the first region by supplying a first gas, which includes an organic acid group, while including a self-assembling molecule, or by supplying a second gas, which includes a condensable group, while including a self-assembling molecule.

11 Claims, 17 Drawing Sheets

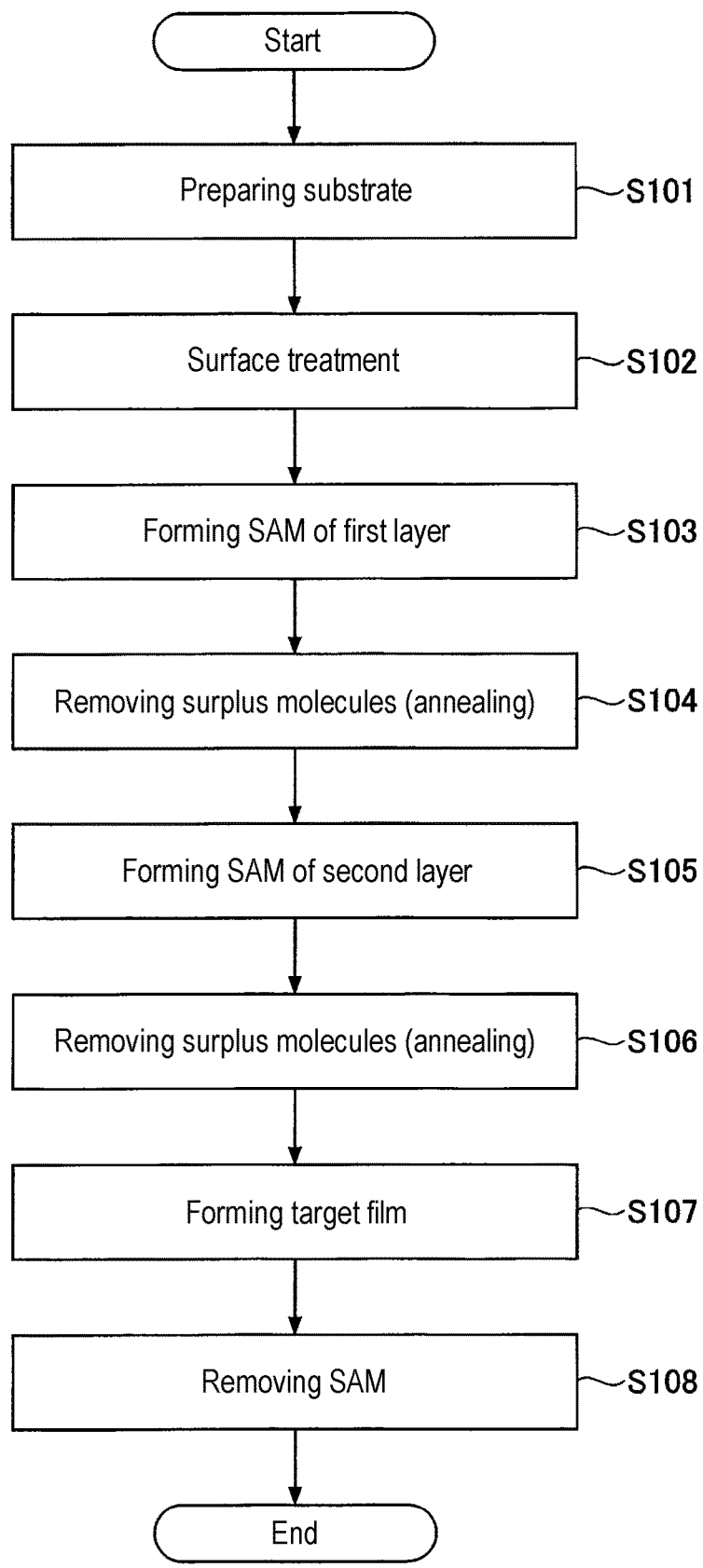

FILM FORMATION METHOD

CROSS-REFERENCE TO RELATED APPLICATIONS

The present application is a U.S. National Stage Entry of International Patent Application No. PCT/JP2021/003467, filed Feb. 1, 2021, which claims the benefit of priority to Japanese Patent Application No. 2020-023765, filed Feb. 14, 2020, each of which is hereby incorporated herein by reference in its entirety.

TECHNICAL FIELD

The present disclosure relates to a film formation method.

BACKGROUND

Patent Document 1 discloses a technology of manufacturing a metal coated with a self-assembled monolayer which includes a molecular film of a mercaptocarboxylic acid represented by the general formula: $HS-(CH_2)_n-COOH$ (n is an integer of 3 to 30) on the metal surface, while including, on the molecular film, Cu ions for bonding first and second layers and, on the Cu ions, a molecular film to which an alkylthiol represented by the general formula: $HS-R$ (R is an alkyl group having 5 to 30 carbon atoms) is bonded.

PRIOR ART DOCUMENTS

Patent Documents

Patent Document 1: Japanese laid-open publication No. 2005-053116

The present disclosure provides a technology capable of forming a self-assembled monolayer that has a high density or a thick film thickness.

SUMMARY

According to an aspect of the present disclosure, there is provided a film formation method including: a step of preparing a substrate including a layer of a first material that is formed on a surface in a first region, and a layer of a second material that is formed on a surface in a second region, wherein the second material is different from the first material; a first SAM formation step of forming a first self-assembled monolayer in the first region by supplying a raw material gas for the first self-assembled monolayer, wherein the raw material gas corresponds to the first material; and a second SAM formation step for forming a second self-assembled monolayer including an organic acid group or a second self-assembled monolayer including a condensable group on top of the first self-assembled monolayer in the first region by supplying a first gas, which includes an organic acid group, while including a self-assembling molecule, or by supplying a second gas, which includes a condensable group, while including a self-assembling molecule.

According to an aspect, it is possible to form a self-assembled monolayer that has a high density or a thick film thickness.

BRIEF DESCRIPTION OF DRAWINGS

FIG. 1 is a flowchart illustrating an example of a film formation method according to an embodiment.

DETAILED DESCRIPTION

Figure 2A:
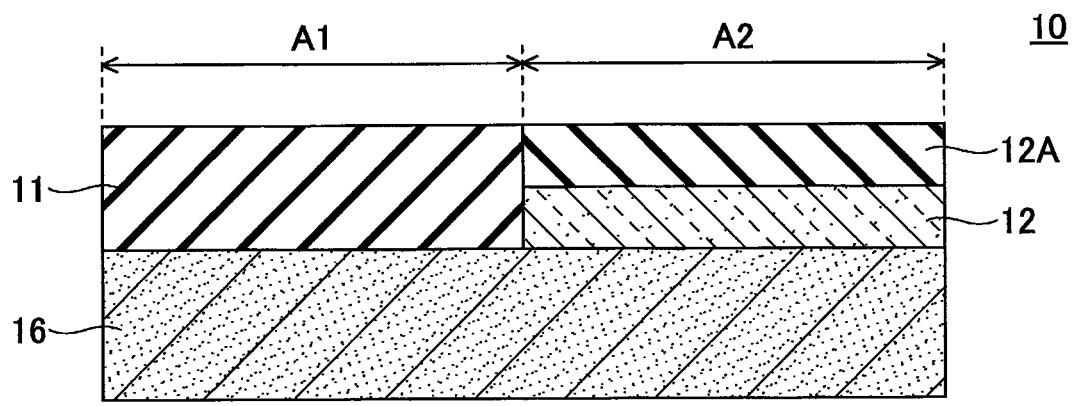
FIG. 2A is a cross-sectional view illustrating an example of a state of a substrate in each step illustrated in FIG. 1.

Hereinafter, embodiments for executing the present disclosure will be described with reference to drawings. In the specification and drawings, constituent elements that are substantially the same in configuration will be denoted by the same reference numerals, and redundant descriptions may be omitted. Hereinbelow, a description will be made using a vertical direction or relationship in the drawings, but it does not represent a universal vertical direction or relationship.

Embodiment

FIG. 1 is a flowchart illustrating an example of a film formation method according to an embodiment. FIGS. 2A to 2D and FIGS. 3A to 3D are cross-sectional views illustrating examples of the states of a substrate in respective steps illustrated in FIG. 1. FIGS. 2A to 2D and FIG. 3A to 3D illustrate, respectively, the states of a substrate 10 corresponding to steps S101 to S108 illustrated in FIG. 1.

As illustrated in FIG. 2A, a film formation method includes step S101 of preparing a substrate 10. Preparing the substrate 10 includes, for example, carrying the substrate 10 into, for example, a processing container (chamber) of a film formation apparatus. The substrate 10 includes an insulating film 11, an a-Si film 12, an oxide film 12A, and a base substrate 16.

The insulating film 11 and the a-Si film 12 are provided on one surface (the top surface in FIG. 2A) of the base substrate 16. The oxide film 12A is provided on the one surface (the top surface in FIG. 2A) of the a-Si film 12. In FIG. 2A, the insulating film 11 and the oxide film 12A are exposed on the surface of the substrate 10.

The substrate 10 has a first region A1 and a second region A2. Here, as an example, the first region A1 and the second region A2 are adjacent to each other in a plan view. The insulating film 11 is provided on the top surface side of the base substrate 16 in the first region A1, and the a-Si film 12 is provided on the top surface side of the base substrate 16 in the second region A2. The oxide film 12A is provided on the top surface of the a-Si film 12 in the second region A2.

The number of first regions A1 is one in FIG. 2A, but may be two or more. For example, two first regions A1 may be disposed with a second region A2 interposed therebetween. Similarly, the number of second regions A2 is one in FIG. 2A, but may be two or more. For example, two second regions A2 may be disposed with a first region A1 interposed therebetween.

In addition, only the first region A1 and the second region A2 are present in FIG. 2A, but a third region may be further present. The third region is a region in which a layer made of a material different from those of the insulating film 11 in the first region A1 and the oxide film 12A in the second region A2 is exposed. The third region may be disposed between the first region A1 and the second region A2, or may be disposed outside the first region A1 and the second region A2.

The insulating film 11 is an example of the layer of the first material. The insulating film 11 is made of an insulating material containing, for example, silicon (Si) and oxygen (O), and is formed of, for example, silicon oxide, silicon oxynitride, silicon carbide, silicon oxycarbonitride, or the like. Hereinafter, silicon oxide is also referred to as SiO regardless of the composition ratio of oxygen and silicon. Similarly, silicon oxynitride is also referred to as SiON, silicon carbide is also referred to as SiOC, and silicon oxynitride is also referred to as SiOCN. In addition, the insulating film 11 may be an insulating film made of a so-called low-k material having a low dielectric constant. The insulating film 11 is a SiO film in this embodiment. Depending on the film type of the SAM 13 to be formed later, the insulating film 11 may be made of an oxygen-free insulating material.

The a-Si (amorphous silicon) film 12 is an example of a layer of the second material. An oxide film 12A is provided on the surface of the a-Si film 12. The oxide film 12A is, for example, an oxide of amorphous silicon formed by natural oxidation. Amorphous silicon oxides do not have a periodic regular structure.

Although the form in which the layer of the second material is the a-Si film 12 will be described here, the layer of the second material may be, for example, a silicon layer, a polysilicon layer, or a metal layer. A natural oxide film is also formed on the surfaces of the silicon layer, the polysilicon layer, and the metal layer.

The base substrate 16 is a semiconductor substrate such as a silicon wafer. The substrate 10 may further include, between the base substrate 16 and the insulating film 11, a base film formed of a material different from those of the base substrate 16 and the insulating film 11. Similarly, the substrate 10 may further include, between the base substrate 16 and the a-Si film 12, a base film formed of a material different from those of the base substrate 16 and the a-Si film 12.

Such a base film may be, for example, a SiN layer or the like. The SiN layer or the like may be, for example, an etch stop layer that stops etching.

Figure 2B:
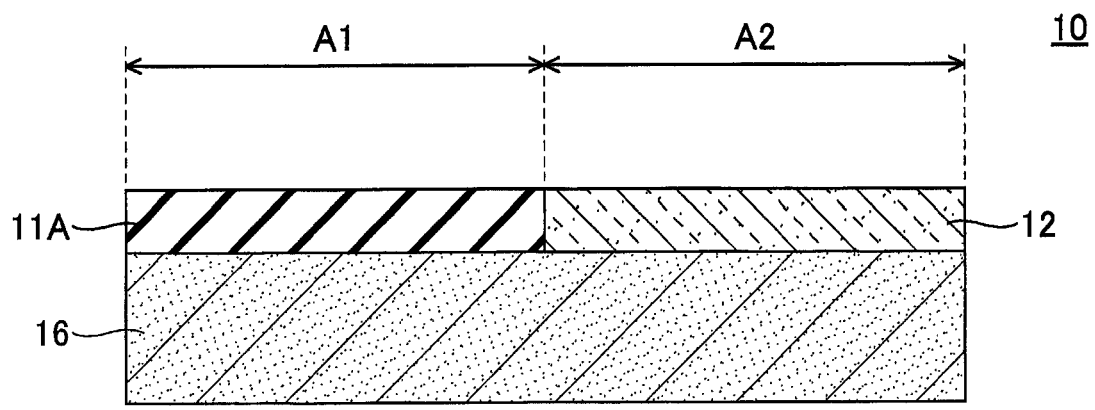
FIG. 2B is a cross-sectional view illustrating an example of a state of a substrate in each step illustrated in FIG. 1.

The film formation method includes step S102 of fabricating the substrate 10 illustrate in FIG. 2B by performing surface treatment on the substrate 10 illustrated in FIG. 2A. The surface treatment is, for example, wet etching performed with a diluted hydrofluoric acid. By the surface treatment in step S102, the surface portion of the insulating film 11 and the oxide film 12A illustrated in FIG. 2A are removed. As a result, as illustrated in FIG. 2B, a substrate 10 including an insulating film 11A, an a-Si film 12, and a base substrate 16 is obtained. The insulating film 11A is a portion remaining after removing the surface portion of the insulating film 11 illustrated in FIG. 2A. In FIG. 2B, SiO as the insulating film 11A is exposed on the surface of the first region A1 of the substrate 10, and the a-Si film 12 is exposed on the surface of the second region A2.

Figure 2C:
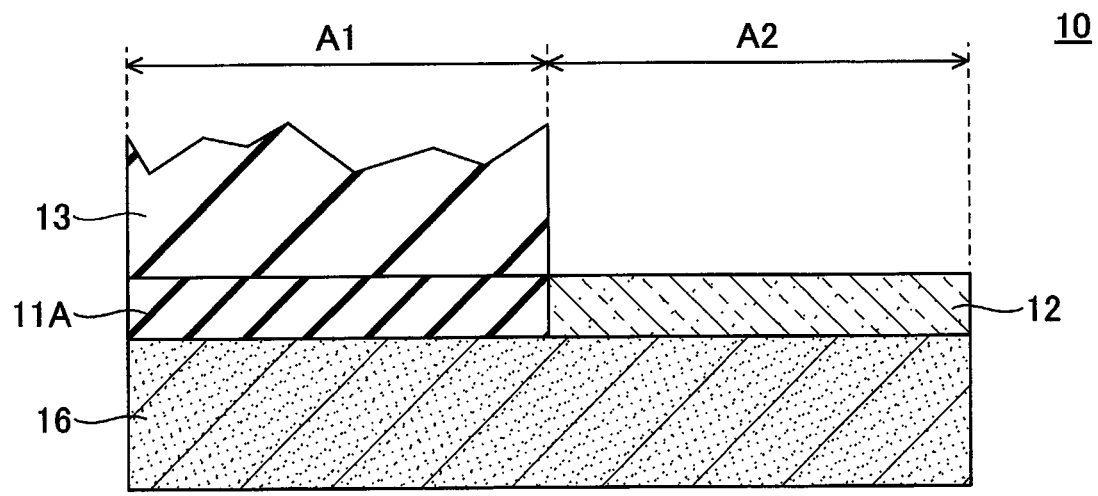
FIG. 2C is a cross-sectional view illustrating an example of a state of a substrate in each step illustrated in FIG. 1.

The film formation method includes step S103 of forming a self-assembled monolayer (SAM) 13, as illustrated in FIG. 2C. In the step S103, the SAM 13 is formed by excessively supplying (overflowing) the raw material gas over a longer period of time than that required for forming the SAM 13A to be described later. The formation time is lengthened so that the density of the SAM 13A to be obtained later is sufficiently high. The SAM 13A is an example of the first self-assembled monolayer.

The SAM 13 is formed in the first region A1 of the substrate 10 in order to inhibit the formation of a target film 15 (see FIG. 3C) to be described later. The SAM 13 is not formed in the second region A2.

An organic compound gas (a raw material gas) for forming the SAM 13 may be any raw material gas for the self-assembled monolayer adsorbed on the surface of the insulating film 11A composed of SiO. For example, a perfluoropolyether group-containing alkoxysilane may be used. Here, as an example, a mode in which a perfluoropolyether group-containing trimethoxysilane among perfluoropolyether group-containing alkoxysilanes is used as the organic compound (raw material) for forming the SAM 13 will be described.

The perfluoropolyether group-containing trimethoxysilane is a compound that causes a dehydration condensation reaction with an oxide film. Therefore, the SAM 13 is adsorbed on the surface of the insulating film 11A composed of the oxide film, and is difficult to be adsorbed on the surface of the a-Si film 12. Therefore, the SAM 13 is selectively formed on the surface of the insulating film 11A.

In step S103, the SAM 13 is formed on the surface of the insulating film 11A, and as illustrated in FIG. 2C, the substrate 10 on which the insulating film 11A and the SAM 13 are formed in the first region A1 and the a-Si film 12 is formed in the second region A2 is obtained. In FIG. 2C, the SAM 13 and the a-Si film 12 are exposed on the surface of the substrate 10. In step S103, the selectivity of the perfluoropolyether group-containing trimethoxysilane for forming the SAM 13 is used.

Here, the molecular structure of the SAMs 13 and 13A formed on the surface of the insulating film 11A and the surface roughness of the insulating film 11A and the SAMs 13 and 13A will be described with reference to FIGS. 4A to 5C.

Figure 4A:
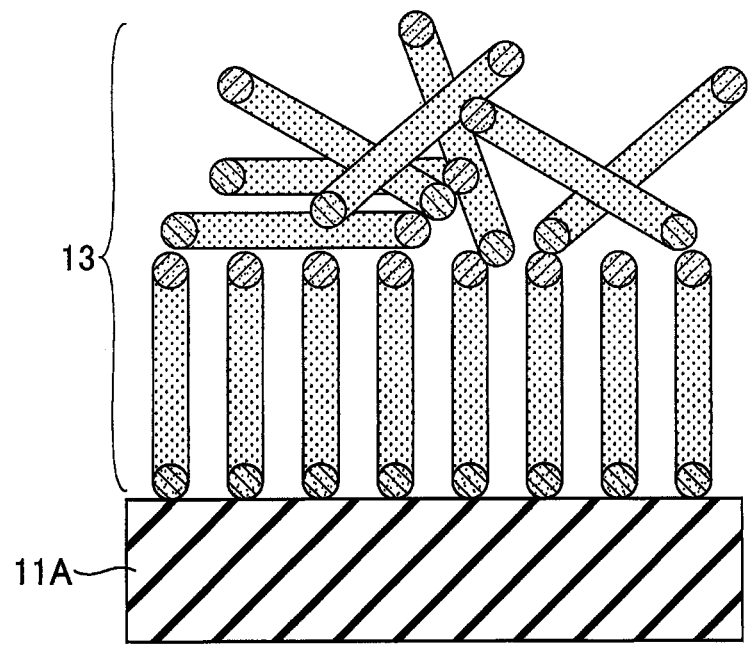
FIG. 4A is a view illustrating an example of a molecular structure of a SAM.
Figure 4B:
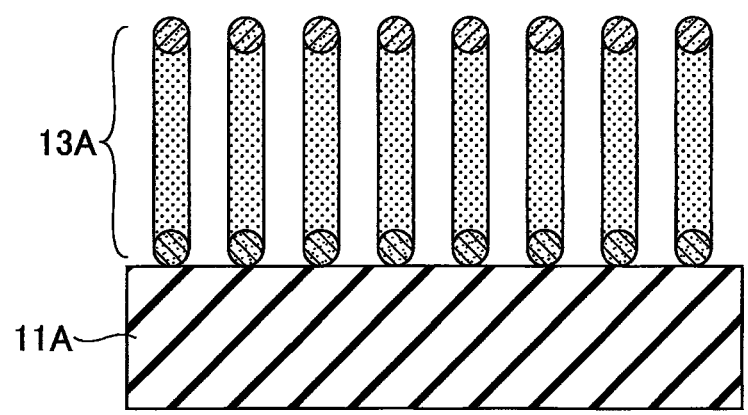
FIG. 4B is a view illustrating an example of a molecular structure of a SAM.

FIGS. 4A and 4B are views each illustrating an example of the molecular structure of the SAM 13. FIGS. 4A and 4B illustrate the molecular structures of the insulating film 11A of the substrate 10 and the SAMs 13 and 13A in a simplified manner.

When a raw material gas for forming the SAM 13 is supplied into the processing container and the step S103 is performed so that the SAM 13 having a high density to some extent is obtained, as illustrated in FIG. 4A, the molecules adsorbed on the surface of the insulating film 11A are turned into a highly oriented molecular layer having an orientation and stability due to van der Waals force between molecules. However, the molecules that are not adsorbed on the surface of the insulating film 11A are considered to be surplus molecules that are irregularly overlapped on the highly oriented molecular layer.

Therefore, for example, when an annealing process for heating the substrate 10 is performed in a predetermined atmosphere in order to remove surplus molecules, as illustrated in FIG. 4B, a SAM 13A formed of a highly oriented molecular layer is obtained. The SAM 13A is adsorbed on the insulating film 11A by a chemical bond such as a covalent bond or a coordinate bond. The SAM 13A is a highly oriented molecular layer oriented by van der Waals force, and surplus molecules are bonded on top of the SAM 13A by van der Waals force. Since the van der Waals force is weaker than the bond force associated with a chemical bond such as a covalent bond or a coordinate bond between the SAM 13A and the insulating film 11A, the surplus molecules are separated and removed from the highly oriented molecular layer by heating by the an annealing process.

Figure 2D:
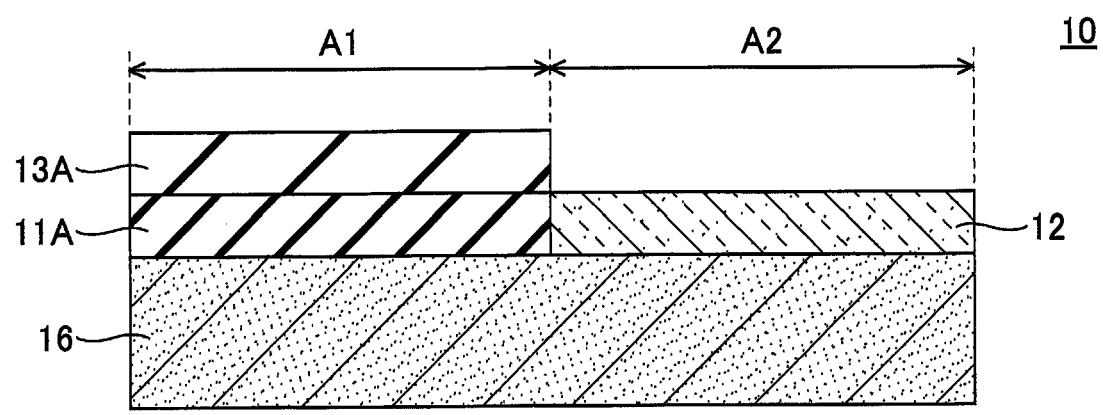
FIG. 2D is a cross-sectional view illustrating an example of a state of a substrate in each step illustrated in FIG. 1.

Therefore, the film formation method includes step S104 of performing an annealing process on the substrate 10 illustrated in FIG. 2C and removing surplus molecules contained in the SAM 13 to fabricate the substrate 10 containing the SAM 13A as illustrated in FIG. 2D. The temperature of the annealing process is, for example, 100 degrees C. to 300 degrees C., preferably 200 degrees C.

Figure 5A:
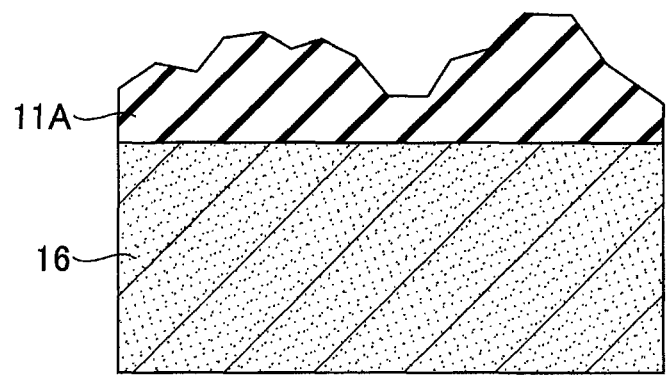
FIG. 5A is an enlarged view illustrating an example of a cross section of a substrate on which an insulating film and a SAM are exposed.
Figure 5B:
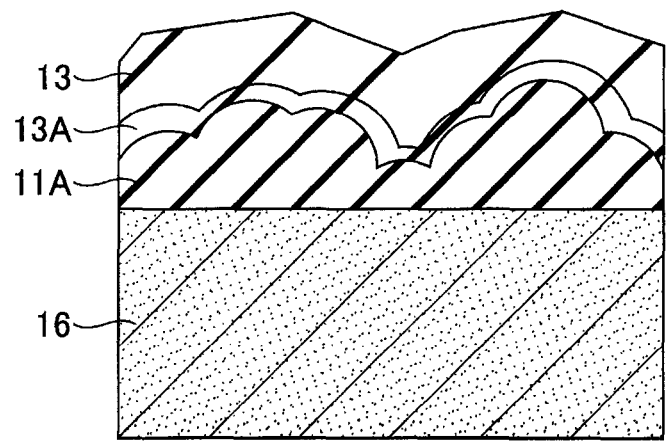
FIG. 5B is an enlarged view illustrating an example of a cross section of a substrate on which an insulating film and a SAM are exposed.
Figure 5C:
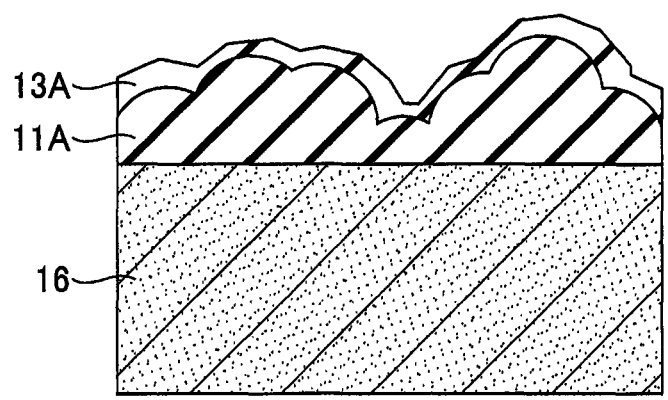
FIG. 5C is an enlarged view illustrating an example of a cross section of a substrate on which an insulating film and a SAM are exposed.

FIGS. 5A to 5C are enlarged views illustrating an example of a cross section of the substrate 10 on which an insulating film 11A and SAMs 13 and 13A are exposed. Here, the surface roughness of the insulating film 11A and the SAMs 13 and 13A will be described with reference to FIGS. 5A to 5C. The cross-sectional shapes illustrated in FIGS. 5A to 5C are cross-sectional shapes based on the results of measuring the surface roughness of the substrate 10 on which the insulating film 11A and the SAMs 13 and 13A are formed, with an electron microscope. In addition, FIGS. 5A to 5C illustrate cross sections of a portion corresponding to the first region A1.

As illustrated in FIG. 5A, the surface roughness of the insulating film 11A after the surface treatment in step S102 was such that the roughness was slightly conspicuous. As illustrated in FIG. 5B, the cross section after the raw material gas was excessively supplied to form the SAM 13 of the first layer of the step S103 shows that the thickness of the SAM 13 is sufficiently thick. In FIG. 5B, of the SAMs 13, the SAM 13A left in the step S104 is illustrated separately. Of the SAMs 13, the portion not contained in the SAM 13A is surplus molecules.

As illustrated in FIG. 5C, the surface roughness of the SAM 13A after the annealing process was performed in step S104 is about ½ of the surface roughness of the insulating film 11A illustrated in FIG. 5A. A smaller surface roughness value indicates that the surface becomes less rough (becomes smoother). The surface roughness may be measured with, for example, an atomic force microscope (AFM).

Figure 3A:
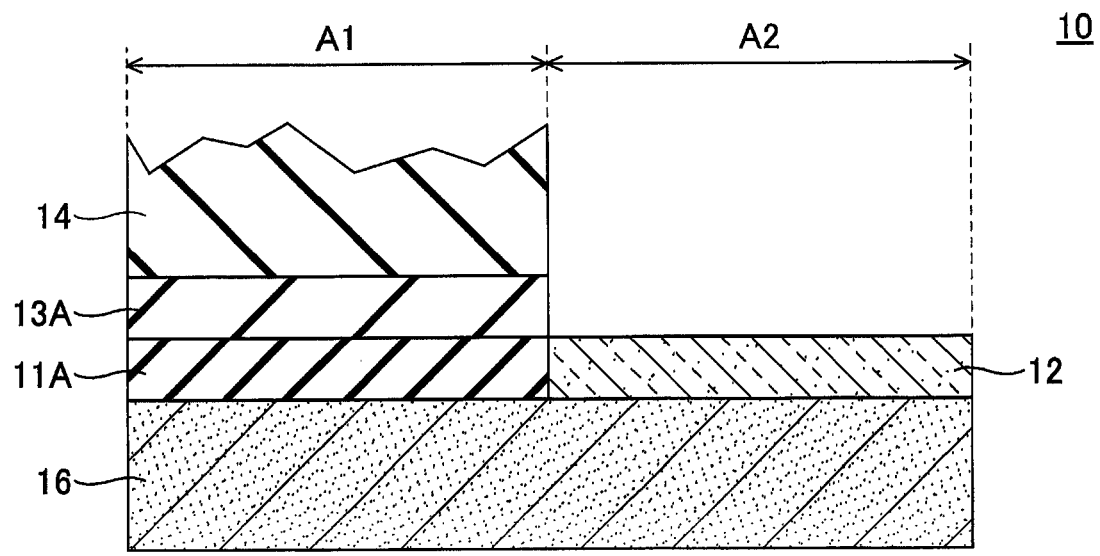
FIG. 3A is a cross-sectional view illustrating an example of a state of a substrate in each step illustrated in FIG. 1.

As illustrated in FIG. 3A, the film formation method includes step S105 of forming a SAM 14 on top of the SAM 13A. The SAM 14 is formed on top of the SAM 13A by supplying a raw material gas from above the SAM 13A to the first region A1 of the substrate 10 in order to inhibit the formation of a target film 15 (see FIG. 3C), which will be described later, together with the SAM 13A. The SAM 14 is not formed in the second region A2.

As an organic compound (raw material) for forming the SAM 14, for example, a raw material of a SAM containing an organic acid group reactive with oxygen of the perfluoropolyether group of the SAM 13A may be used. The organic acid group is a functional group containing an organic acid. Such a raw material gas is an example of the first gas, and may be, for example, a raw material gas having a perfluoropolyether group-containing carboxylic acid.

The SAM 14 is formed on top of the SAM 13A when the perfluoropolyether group of the SAM 13A reacts with the carboxyl group of the perfluoropolyether group-containing carboxylic acid.

Since the SAM 14 is considered to be in a state in which the surplus molecules are irregularly overlapped on the highly oriented molecular layer, the SAM 14 is shown in a shape having a thick film thickness and including irregularities on the top surface side thereof as in the SAM 13 (FIG. 2C).

Figure 3B:
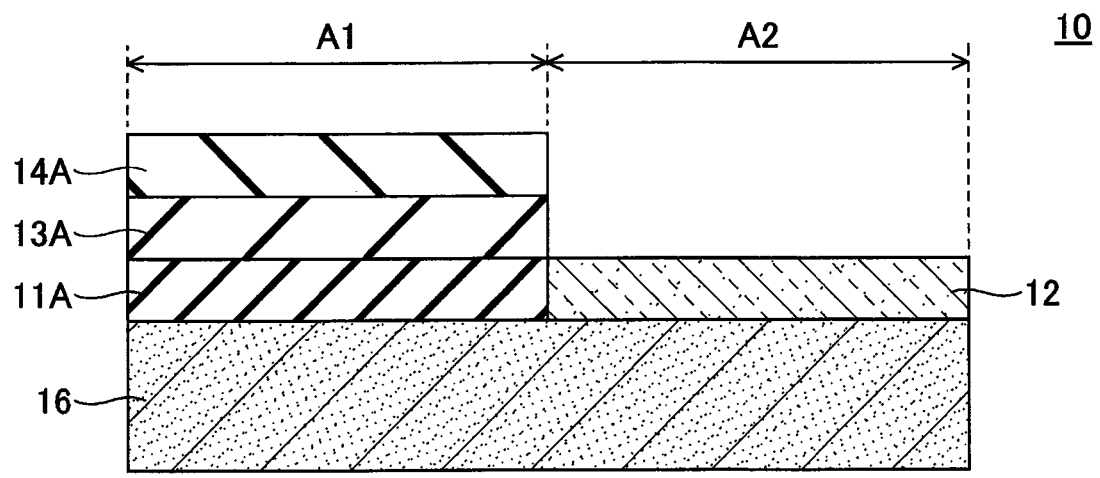
FIG. 3B is a cross-sectional view illustrating an example of a state of a substrate in each step illustrated in FIG. 1.

The film formation method includes step S106 of performing an annealing process on the substrate 10 illustrated in FIG. 3A and removing surplus molecules contained in the SAM 14 to fabricate the substrate 10 containing the SAM 14A as illustrated in FIG. 3B. The temperature of the annealing process is, for example, 100 degrees C. to 300 degrees C., preferably 200 degrees C. The SAM 14A is formed in step S106 by removing the surplus molecules contained in the SAM 14 to leave a highly oriented molecular layer. The SAM 14A is an example of the second self-assembled monolayer.

Figure 6:
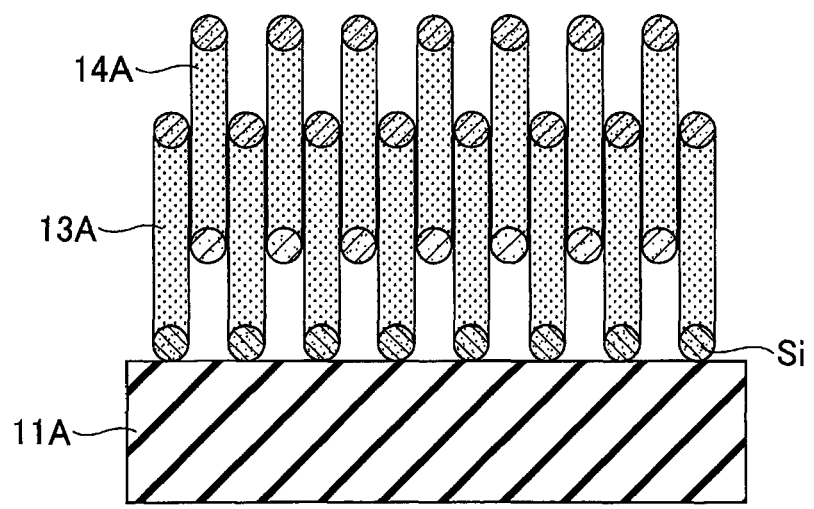
FIG. 6 is a view illustrating an example of a molecular structure.

Here, the molecular structure of the SAM 14A and the surface roughness of the SAM 14A will be described with reference to FIGS. 6 and 7. FIG. 6 is a view illustrating an example of a molecular structure of SAMs 13A and 14A. FIG. 6 illustrates the molecular structure of the insulating film 11A, the SAM 13A, and the SAM 14A existing in the first region A1 of the substrate 10 in a simplified manner.

Since the insulating film 11A is a SiO film and contains a hydroxyl group on the surface, the SAM 13A formed by using a perfluoropolyether group-containing trimethoxysilane as a raw material is considered to be in a state in which the silicon (Si) molecules of trimethoxysilane are adsorbed on the surface of the insulating film 11A. It is considered that perfluoropolyether groups, which are straight chains, extend upward from the silicon molecules adsorbed on the surface of the insulating film 11A.

Since the perfluoropolyether group contains oxygen in a main chain (straight line), it is considered that when a first gas containing a perfluoropolyether group-containing carboxylic acid is supplied into the processing container to form a SAM 14, hydrogen of the carboxylic acid and oxygen in ether form a hydrogen bond.

Therefore, since a head group of a raw material molecule of the SAM 14A is bonded to the main chain of an oriented molecule constituting the SAM 13A, the SAM 14A is considered to have a molecular structure in which the SAM 14A is introduced into the spaces between the molecules of the SAM 13A from above the SAM 13A, as illustrated in FIG. 6. The introduction of the SAM 14A into the spaces between the molecules of the SAM 13A from above the SAM 13A is an example of the formation of SAM 14A on top of the SAM 13A. The results of component analysis of a film in which the SAM 14A is formed on top of the SAM 13A will be described later.

When an annealing process is performed on the substrate 10 illustrated in FIG. 3A in step S106, the surplus molecules contained in the SAM 14 are removed and the SAM 14A, which is a highly oriented molecular layer, remains, so that a molecular structure in which the SAM 14A is introduced into the spaces between the molecules of the SAM 13A as illustrated in FIG. 6 is obtained. The molecular structure in which the SAM 14A is introduced into the spaces between the molecules of the SAM 13A is obtained by forming the SAM 14 on top of the SAM 13A and removing the surplus molecules of the SAM 14.

The molecular structure in which the SAM 14A of the second layer is formed on top of the SAM 13A of the first layer has a higher density than the molecular structure of the SAM 13A alone because the SAM 14A is introduced into spaces between the molecules of the SAM 13A.

Figure 7:
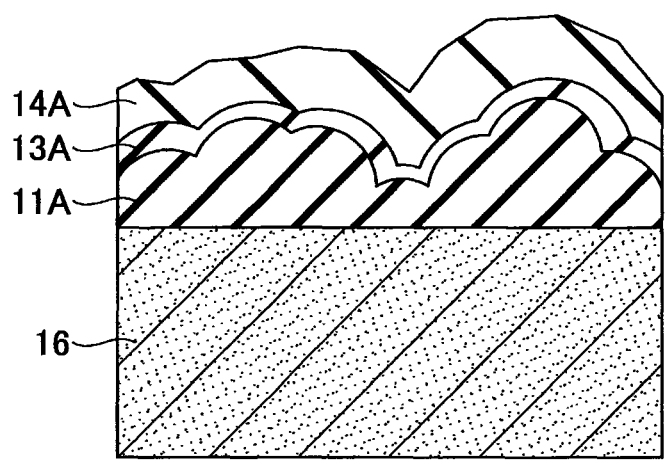
FIG. 7 is an enlarged view illustrating an example of a cross section of a substrate.

FIG. 7 is an enlarged view illustrating an example of a cross section of the substrate 10 on which the SAM 14A is formed. Here, the surface roughness of the SAM 14A will be described with reference to FIG. 7. The cross-sectional shape illustrated in FIG. 7 is a cross-sectional shape based on the results of measuring the surface roughness of the substrate 10 on which the SAM 14A is formed, with an electron microscope. FIG. 7 also illustrates a cross section of the insulating film 11A and the SAM 13A illustrated in FIG. 5C. FIG. 7 illustrates a cross section of a portion corresponding to the first region A1.

The surface roughness of the SAM 14A was about ⅓ of the surface roughness of the SAM 13A. A smaller surface roughness value indicates that the surface becomes less rough (become smoother). The surface roughness may be measured with, for example, an atomic force microscope (AFM).

Figure 3C:
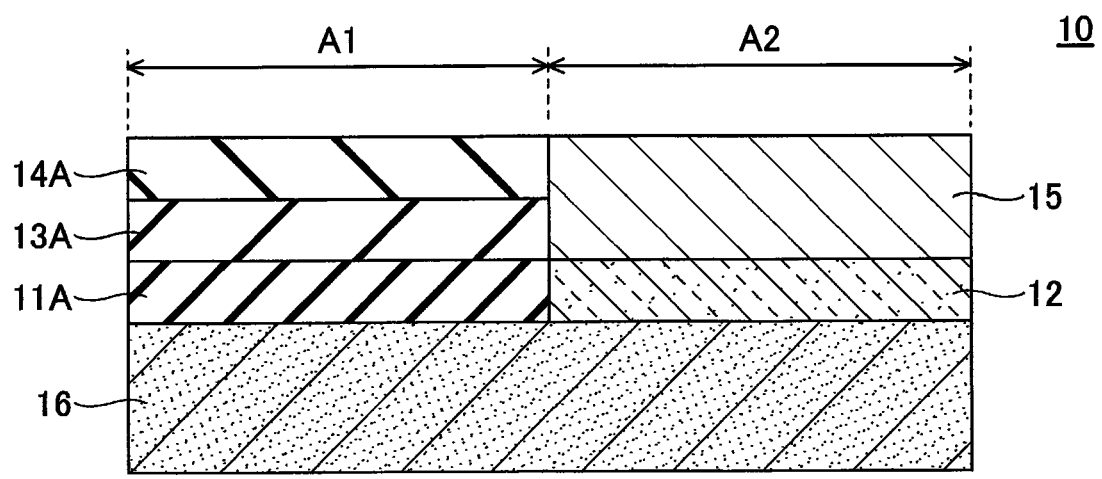
FIG. 3C is a cross-sectional view illustrating an example of a state of a substrate in each step illustrated in FIG. 1.

As illustrated in FIG. 3C, the film formation method includes step S107 of forming a target film 15 selectively in the second region A2 by using the SAMs 13A and 14A. The target film 15 is formed of a material different from those of the SAMs 13A and 14A, for example, a metal, a metal compound, or a semiconductor. Since the SAMs 13A and 14A inhibit the formation of the target film 15, the target film 15 is formed selectively in the second region A2. When a third region is present in addition to the first region A1 and the second region A2, the target film 15 may or may not be formed in the third region.

The target film 15 is formed through, for example, a chemical vapor deposition (CVD) method or an atomic layer deposition (ALD) method. The target film 15, which is an insulating film, may be further laminated on the a-Si film 12, which is originally present in the second region A2.

The target film 15 is, for example, a metal such as copper (Cu), cobalt (Co), ruthenium (Ru), molybdenum (Mo), or tungsten (W), a metal compound such as alumina ($Al_2O_3$) or silicon dioxide ($SiO_2$), or a semiconductor such as amorphous silicon.

Figure 3D:
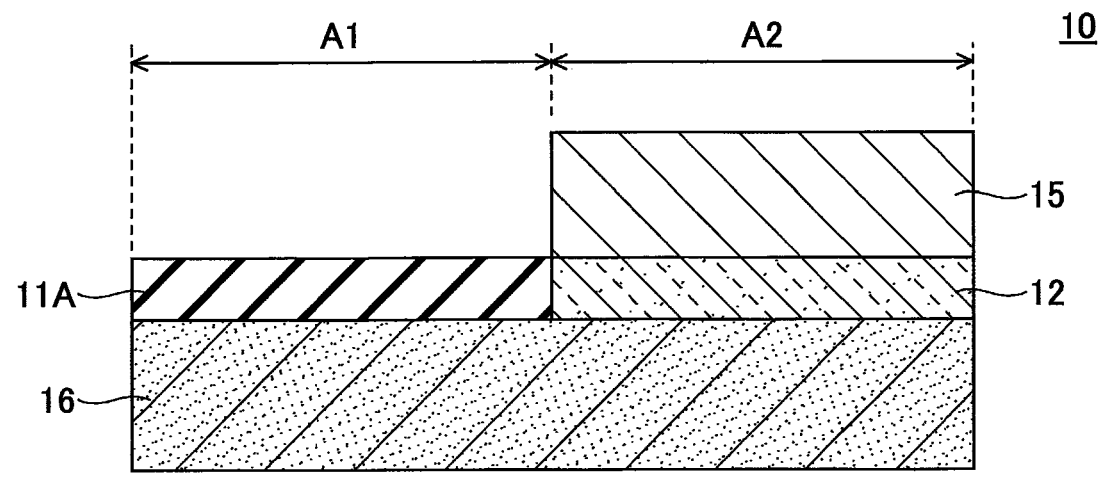
FIG. 3D is a cross-sectional view illustrating an example of a state of a substrate in each step illustrated in FIG. 1.

As shown in FIG. 3D, the film formation method includes step S108 of removing the SAMs 13A and 14A (see FIG. 3C). The SAMs 13A and 14A may be removed, for example, by performing an ashing process using plasma containing oxygen.

As described above, since the SAM 14A formed on top of the SAM 13A has a molecular structure in which the SAM 14A is introduced into the spaces between the molecules of the SAM 13A as shown in FIG. 6, a higher density than the molecular structure of the SAM 13A alone in the first layer is obtained.

Therefore, it is possible to provide a film formation method capable of forming a highly dense self-assembled monolayer (the SAMs 13A and 14A).

In addition, since it is possible to form a highly dense self-assembled monolayer, when the target film 15 is formed, the raw material gas of the target film 15 is hindered from reaching the insulating film 11A of the first region A1 through the gaps between the molecules of the SAMs 13A and 14A, so that it is possible to enhance selectivity in forming the target film 15. Therefore, it is possible to provide a film formation method that realizes a semiconductor manufacturing process having a high yield.

In the above, the mode in which a perfluoropolyether group-containing trimethoxysilane among perfluoropolyether group-containing alkoxysilanes is used as the organic compound (raw material) for forming the SAM 13 has been described. However, organic compounds other than the perfluoropolyether group-containing trimethoxysilane among perfluoropolyether group-containing alkoxysilanes may be used.

The SAM 13A may be formed by using a perfluoropolyether group-containing halosilane instead of the perfluoropolyether group-containing alkoxysilane. The perfluoropolyether group-containing halosilane is also capable of forming a SAM by causing a dehydration condensation reaction on the surface of the insulating film 11A formed of SiO.

In addition, the SAM 13 may be formed by using a raw material capable of forming a SAM, other than the perfluoropolyether group-containing alkoxysilane and the perfluoropolyether group-containing halosilane. In this case, the film exposed to the first region A1 of the substrate 10 may be made of a material other than the insulating film 11A formed of SiO, or may be made of a metal. The raw material of the SAM 13 may be any raw material that can be adsorbed on the film exposed to the first region A1 of the substrate 10.

Next, a first modification of the steps illustrated in FIGS. 3A to 3D will be described with reference to FIGS. 8A to 8D. FIGS. 8A to 8D are cross-sectional view illustrating examples of the states of a substrate in respective steps illustrated in FIG. 1 in the first modification of the embodiment. Here, a mode in which the steps illustrated in FIGS. 8A to 8D are performed on the substrate 10 illustrated in FIG. 2D instead of the steps illustrated in FIGS. 3A to 3D will be described. A substrate 10M1 will be described with reference to FIGS. 8A to 8D.

Figure 8A:
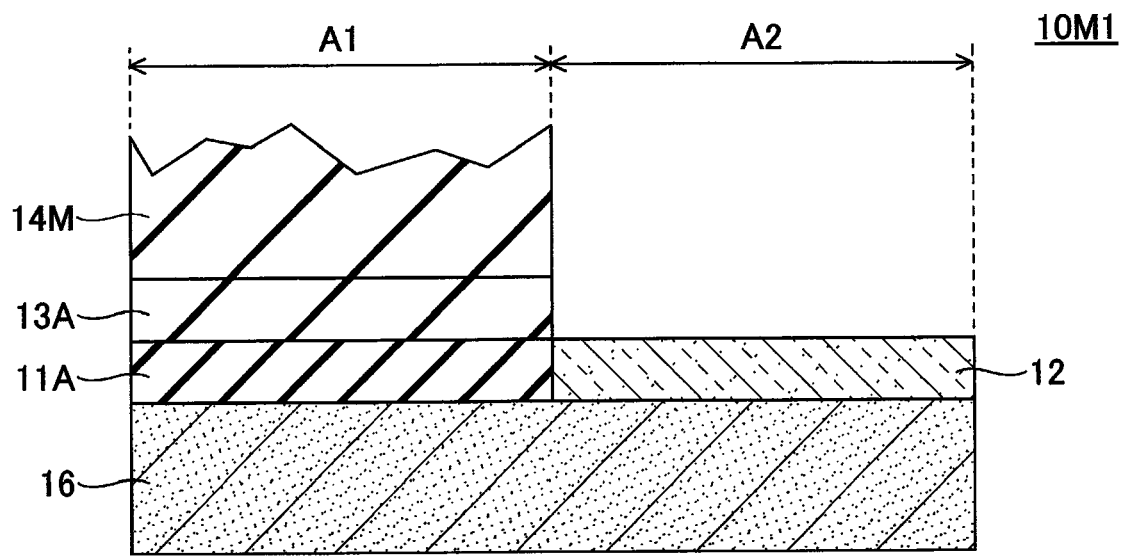
FIG. 8A is a cross-sectional view illustrating an example of the state of a substrate in each step illustrated in FIG. 1 in a first modification of the embodiment.

As illustrated in FIG. 8A, a film formation method includes step S105 of forming a SAM 14M on top of a SAM 13A. The SAM 14M is formed on top of the SAM 13A in the first region A1 of the substrate 10M1 in order to inhibit the formation of a target film 15 (see FIG. 8C), together with the SAM 13A. The SAM 14M is not formed in the second region A2.

As an organic compound (raw material) for forming the SAM 14M, for example, a perfluoropolyether group-containing alkoxysilane may be used like the organic compound (raw material) for forming the SAM 13 (see FIG. 2C). Here, as an example, a mode in which a perfluoropolyether group-containing trimethoxysilane among perfluoropolyether group-containing alkoxysilanes is used as the organic compound (raw material) for forming the SAM 14M will be described. This is the same as the organic compound (raw material) for forming the SAM 13 (see FIG. 2C). The raw material gas for forming the SAM 14M is an example of the second gas, and is a raw material gas containing a functional group having a condensable property (condensable group), while including a self-assembling molecule. This is to form a self-assembling molecule having a condensable group on top of the SAM 13A. The self-assembling molecule having a condensable group refers to, for example, a self-assembling molecule in which molecules of adjacent raw material gases cause a dehydration condensation reaction to form a siloxane bond (Si—O—Si). Here, the condensable group is a trimethoxysilane group.

Similar to the SAM 13 (see FIG. 2C), the SAM 14M is considered to be in a state in which surplus molecules are irregularly stacked on a highly oriented molecular layer, and thus the SAM 14M is illustrated in a shape in which the film thickness is thick and the top surface side has irregularities.

Figure 8B:
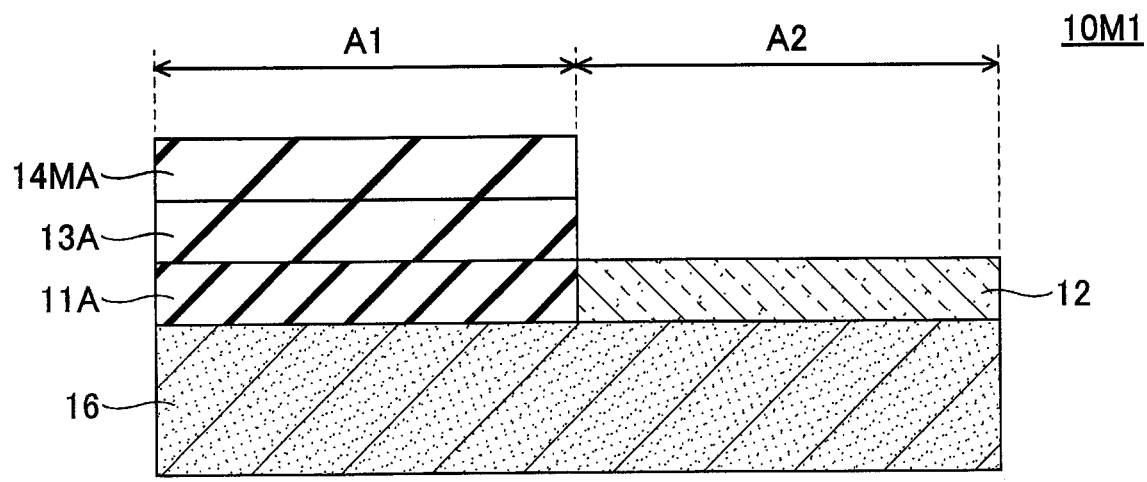
FIG. 8B is a cross-sectional view illustrating an example of the state of a substrate in each step illustrated in FIG. 1 in the first modification of the embodiment.

The film formation method includes step S106 of performing an annealing process on the substrate 10M1 illustrated in FIG. 8A and removing surplus molecules contained in the SAM 14M to fabricate the substrate 10M1 containing the SAM 14MA as illustrated in FIG. 8B. The SAM 14MA is formed in step S106 by removing the surplus molecules contained in the SAM 14M to leave a highly oriented molecular layer. The SAM 14MA is an example of the second self-assembled monolayer.

Figure 9:
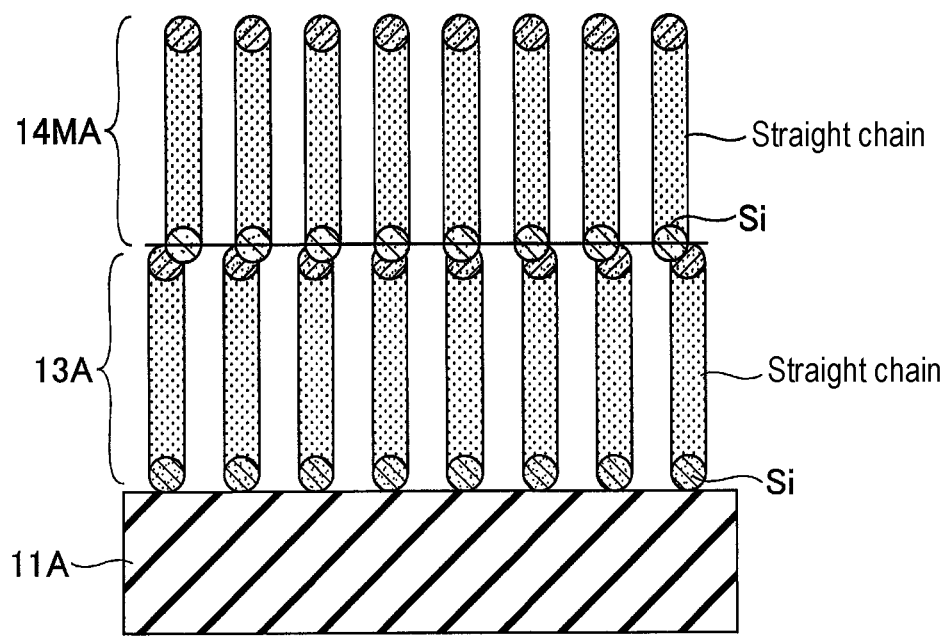
FIG. 9 is a view illustrating an example of a molecular structure.

Here, the molecular structure of SAM 14MA will be described with reference to FIG. 9. FIG. 9 is a view illustrating an example of a molecular structure of SAMs 13A and 14MA. FIG. 9 illustrates the molecular structure of the insulating film 11A, the SAM 13A, and the SAM 14MA existing in the first region A1 of the substrate 10M1 in a simplified manner.

It is considered that the trifluoromethyl ($CF_3$) group of the perfluoropolyether group is located at the end of the molecule of the SAM 13A. The end is a straight chain end (the most end) when viewed from the silicon molecule of trimethoxysilane adsorbed on the insulating film 11A. Since the trifluoromethyl ($CF_3$) group has low reactivity, adjacent trifluoromethyl ($CF_3$) groups are in the state of being arranged side by side without being bonded to each other. When the raw material gas of SAM 14M is supplied to top of the SAM 13A in the state of being arranged state as described above, it is considered that the silane portions of adjacent perfluoropolyether group-containing trimethoxysilanes cause a dehydration condensation reaction to form a siloxane bond (Si—O—Si).

As a result, as illustrated in FIG. 9, it is considered that a highly oriented molecular layer in which silicon molecules located closest to the base substrate 16 side are bonded to each other with oxygen sandwiched therebetween is obtained as the SAM 14MA. In FIG. 9, the bonding between the silicon molecules with oxygen sandwiched therebetween is illustrated by a solid line connecting the silicon molecules.

That is, the substrate 10M1 illustrated in FIG. 8B has a structure in which the highly oriented molecular layer of the SAM 14MA is superimposed on the highly oriented molecular layer of SAM 13A.

In the molecular structure in which the SAM 14MA of the second layer is formed on top of the SAM 13A of the first layer obtained as described above, the highly oriented molecular layer of the SAM 14MA is superimposed on the highly oriented molecular layer of the SAM 13A. Therefore, the film thickness of the above-mentioned molecular structure is thicker than the molecular structure of the SAM 13A alone.

Figure 8C:
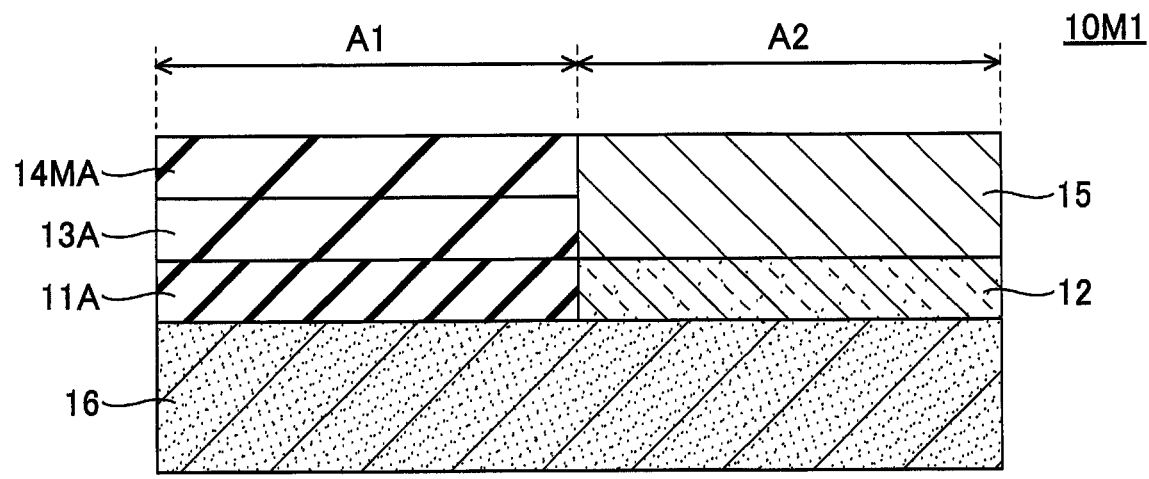
FIG. 8C is a cross-sectional view illustrating an example of the state of a substrate in each step illustrated in FIG. 1 in the first modification of the embodiment.
Figure 8D:
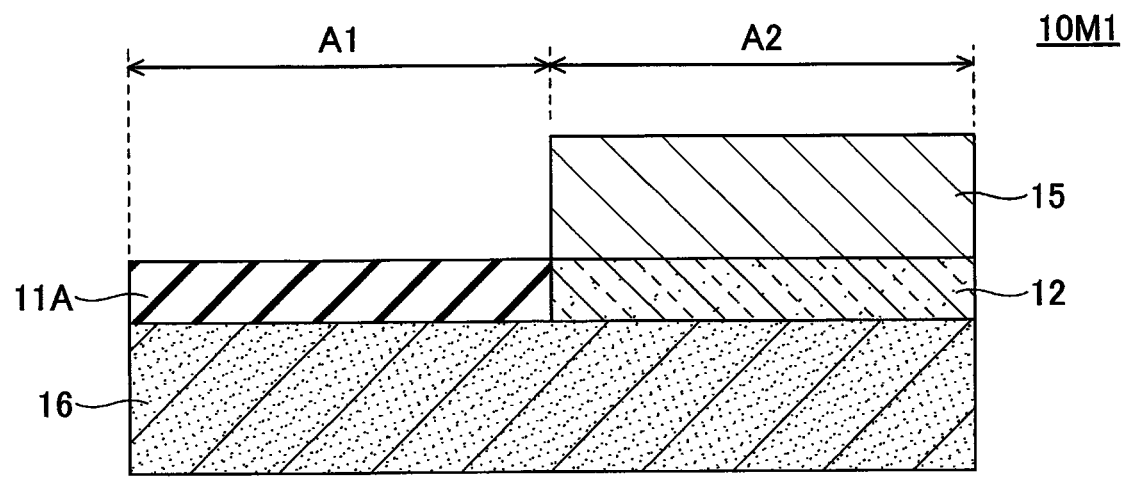
FIG. 8D is a cross-sectional view illustrating an example of the state of a substrate in each step illustrated in FIG. 1 in the first modification of the embodiment.

The film formation step includes step S107 for selectively forming the target film 15 in the second region A2 by using the SAMs 13A and 14MA as illustrated in FIG. 8C, and step S108 of removing the SAMs 13A and 14MA (see FIG. 8C) as illustrated in FIG. 8D. The processes illustrated in FIGS. 8C and 8D are the same as the processes illustrated in FIGS. 3C and 3D.

As described above, since the molecular structure in which the SAM 14MA is formed on top of the SAM 13A has a double structure in which the highly oriented molecular layer of the SAM 14MA is superimposed on the highly oriented molecular layer of the SAM 13A as illustrated in FIG. 9, the film thickness thereof is thicker than the molecular structure of the layer SAM 13A alone.

Therefore, it is possible to provide a film formation method capable of forming a thick self-assembled monolayer (the SAMs 13A and 14MA).

In addition, since it is possible to form a thick self-assembled monolayer, when the target film 15 is formed, the raw material gas of the target film 15 is hindered from reaching the insulating film 11A of the first region A1 through the gaps between the molecules of the SAMs 13A and 14A, so that it is possible to enhance selectivity in forming the target film 15. Therefore, it is possible to provide a film formation method that realizes a semiconductor manufacturing process having a high yield.

In the first modification of the embodiment, the mode in which a perfluoropolyether group-containing trimethoxysilane among perfluoropolyether group-containing alkoxysilanes is used as the organic compound (raw material) for forming the SAM 13 have been described. However, organic compounds other than the perfluoropolyether group-containing trimethoxysilane among perfluoropolyether group-containing alkoxysilanes may be used.

The SAM 13A may be formed by using a perfluoropolyether group-containing halosilane instead of the perfluoropolyether group-containing alkoxysilane. The perfluoropolyether group-containing halosilane is also capable of forming a SAM by causing a dehydration condensation reaction on the surface of the insulating film 11A formed of SiO.

In addition, the SAM 13 may be formed by using a raw material capable of forming a SAM, other than the perfluoropolyether group-containing alkoxysilane and the perfluoropolyether group-containing halosilane. In this case, the film exposed to the first region A1 of the substrate 10M1 may be made of a material other than the insulating film 11A formed of SiO, or may be made of a metal. The raw material of the SAM 13 may be any raw material that can be adsorbed on the film exposed to the first region A1 of the substrate 1041.

Here, results of component analysis in the substrate 10 in a state in which the SAM 13A illustrated in FIG. 2D of the embodiment is formed, the substrate 10 in a state in which the SAM 14A illustrated in FIG. 3B of the embodiment is formed, and the substrate 10M1 in a state in which the SAM 14MA illustrated in FIG. 8B of the first modification of the embodiment is formed will be described.

Figure 10A:
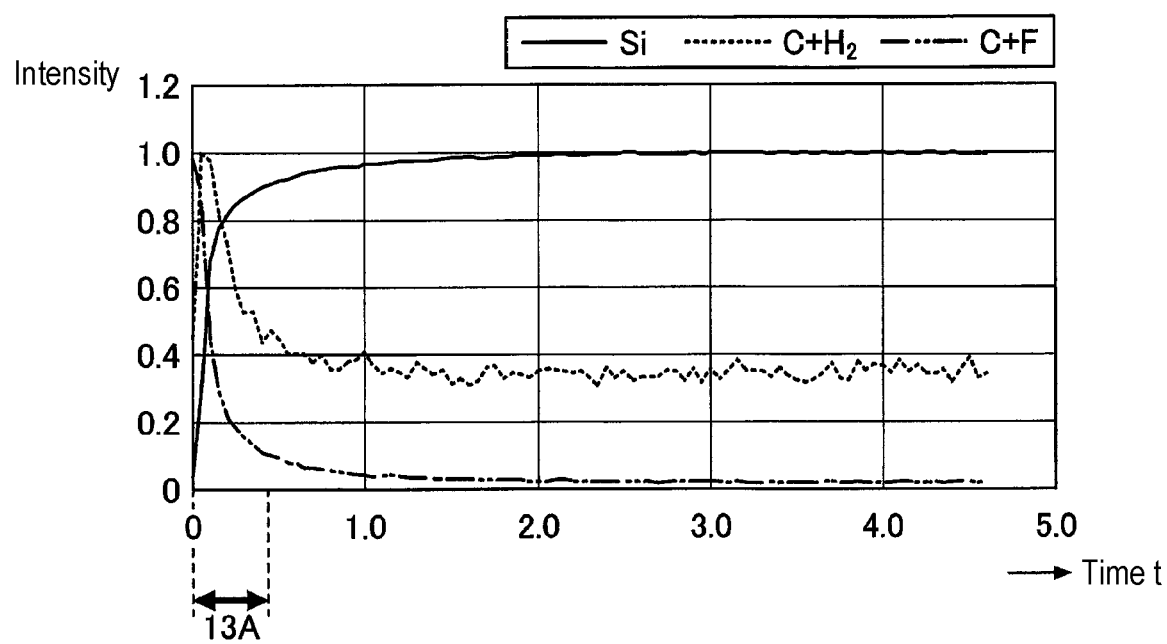
FIG. 10A is a view showing component analysis results
Figure 10B:
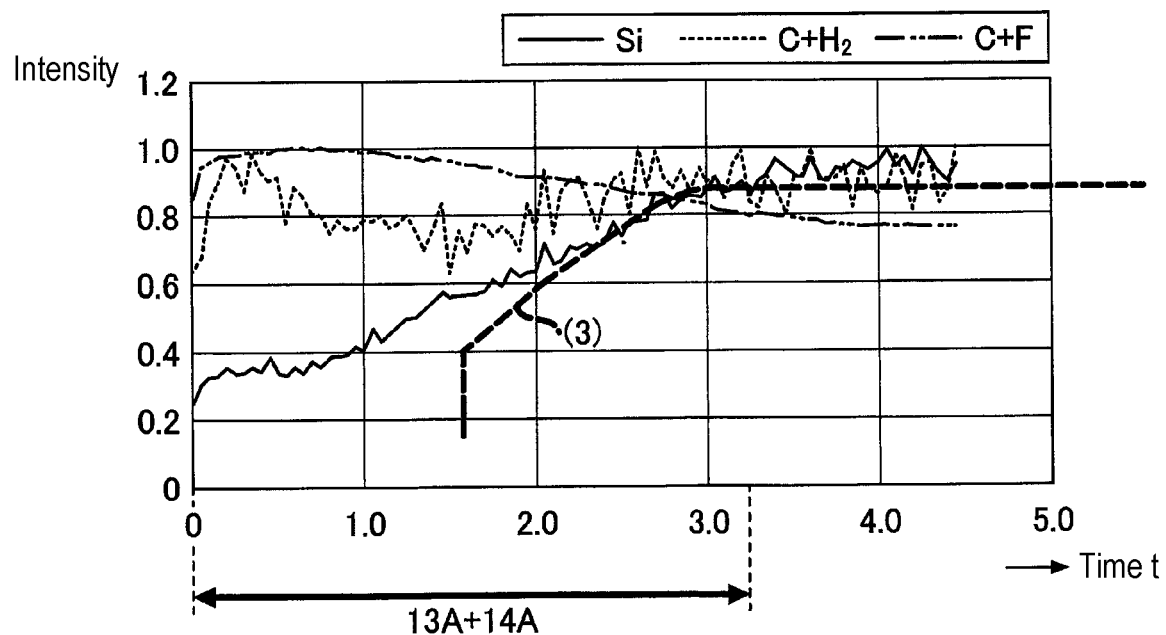
FIG. 10B is a view showing component analysis results
Figure 10C:
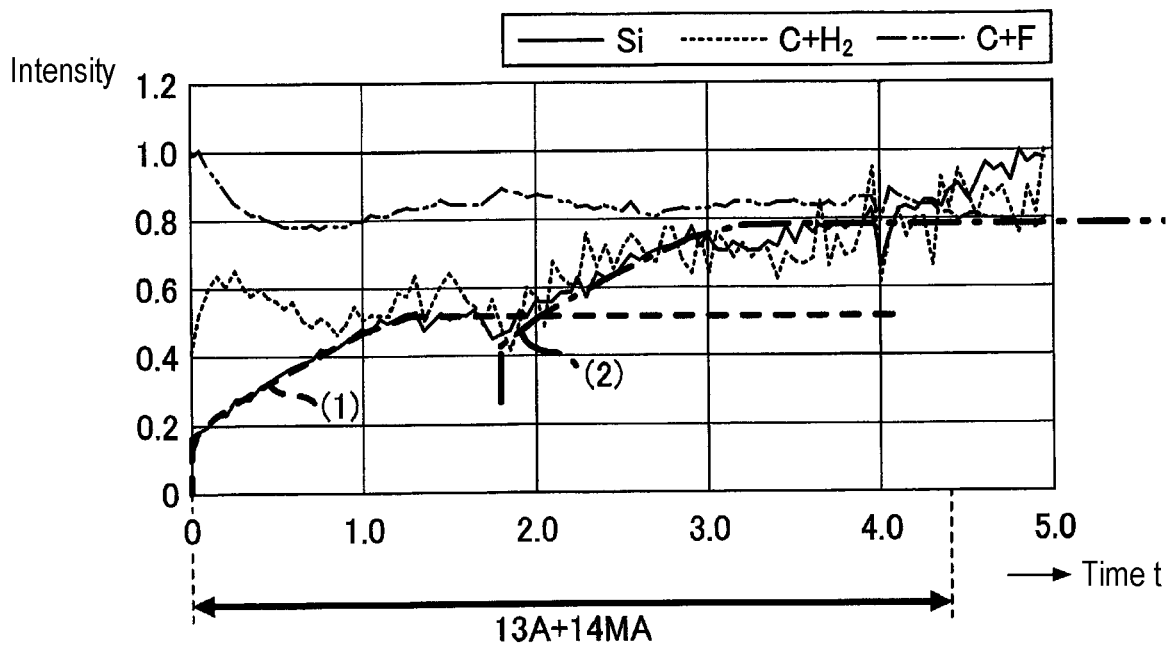
FIG. 10C is a view showing component analysis results

FIGS. 10A to 10C are views showing the component analysis results. FIGS. 10A to 10C shows the detection levels of molecules measured by time-of-flight secondary ion mass spectrometry (TOF-SIMS) on the substrate 10 illustrated in FIG. 2D, the substrate 10 illustrated FIG. 3B, and the substrate 10M1 illustrated in FIG. 8B, respectively. The horizontal axis represents a standardized time t for which sputtering was performed with a sputter ion gun, and the vertical axis represents a standardized detection level (intensity) of each molecule. Since the horizontal axis represents the sputtering time, it corresponds to the depth from the surface.

Since the SAM 13A illustrated in FIG. 2D is formed by using a gas containing a perfluoropolyether group-containing trimethoxysilane as a raw material gas, Si of the trimethoxysilane is adsorbed on the surface of the insulating film 11A to cause a dehydration condensation reaction, and the perfluoropolyether group, which is a straight chain, extends to the end. Next to a trimethoxysilane, which is a functional group, a CH bond of a straight chain is present, and at the end of the straight chain, a CF bond is present.

Therefore, as shown in FIG. 10A, in the substrate 10 on which the SAM 13A (FIG. 2D) is formed, the sputtering is started at time t=0, and then the detection level of C+F rises to about 1 and then falls. Thereafter, the detection level of $C+H_2$ increases, and after the detection level of $C+H_2$ decreases, the detection level of Si increases. The SAM 13A is detected in the section indicated by the double-headed arrow from the time t=0.

Therefore, it was confirmed that the SAM 13A formed from the perfluoropolyether group-containing trimethoxysilane as a raw material was formed.

Next, the SAM 14MA (see FIG. 8B) will be described with reference to FIG. 10C. The SAMs 14MA and 13A are formed by using a gas containing a perfluoropolyether group-containing trimethoxysilane as a raw material gas. Therefore, Si of the trimethoxysilane is present on the SAM 13A of the first layer, and the perfluoropolyether group, which is a straight chain, extends toward the end. Next to the functional group, a CH bond of a straight chain is present, and at the end of the straight chain, a CF bond is present.

In FIG. 10C, the detection level of Si starts to increase from time t=0, becomes almost flat once at time t=about 1.2, and then increases again from time t=about 2.0. That is, the detection level of Si has a characteristic similar to the addition of two Si detection levels of the broken line (1) shown according to the Si detection level in FIG. 10C and the alternate long and short dash line (2) shown from time t=about 1.8.

In addition, the detection level of C+F first increases on the surface (time t=0) side, the detection level of C+F decreases when the detection level of Si increases, and then the detection level of C+F increases again. Further, when the detection level of Si begins to increase second, the detection level of C+F decreases a little and then increases a little. Thus, the detection level of C+F is linked with the detection level of Si.

From this, it was confirmed that the SAM 13A and the SAM 14MA have a two-layer structure as illustrated in FIG. 9. The SAM 13A and the SAM 14MA are detected in the section indicated by the double-headed arrow from the time t=0.

Next, the SAM 14A (see FIG. 3B) will be described with reference to FIG. 10B. The SAM 14A is formed from a raw material gas containing a perfluoropolyether group-containing carboxylic acid, and the SAM 13A is formed from a gas containing a perfluoropolyether group-containing trimethoxysilane as a raw material gas.

After starting sputtering at time t=0, the detection level of C+F is maintained at a high level of about 1.0 and gradually decreases from time t=about 1.0. This indicates that there is a denser CF bond compared to the detection level of C+F shown in FIG. 10A.

In addition, the fact that the detection level of $C+H_2$ is generally higher compared to the case in which the SAM 13A illustrated in FIG. 10A is a single layer also indicates that a dense CH bond is present.

Furthermore, as shown in FIG. 10C, the detection level of Si continues to increase from time t=0 to time t=about 3.0 without ever flattening. It is considered that this is because the second detection level of Si is added as indicated by the alternate long and short dash line (3) shown from around time t=about 1.6.

It is considered that this detection level was obtained because a carboxyl group is located on the side of the SAM 14A closest to the SAM 13A and Si is located on the side farthest from SAM 13A.

From this, it was confirmed that, as illustrated in FIG. 6, a molecular structure in which the SAM 14A is introduced into the spaces between the molecules of the SAM 13A was obtained. The SAM 13A and the SAM 14A are detected in the section indicated by the double-headed arrow from the time t=0.

Figure 11A:
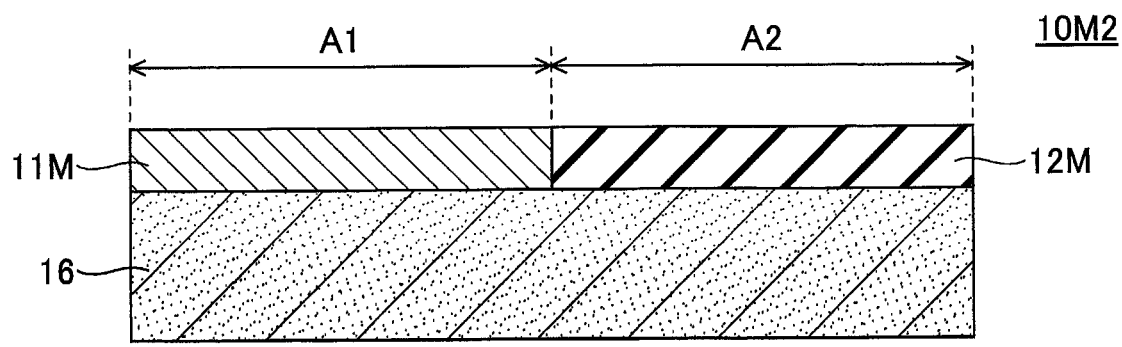
FIG. 11A is a view illustrating an example of a cross-sectional structure of a substrate of a second modification of the embodiment.
Figure 11B:
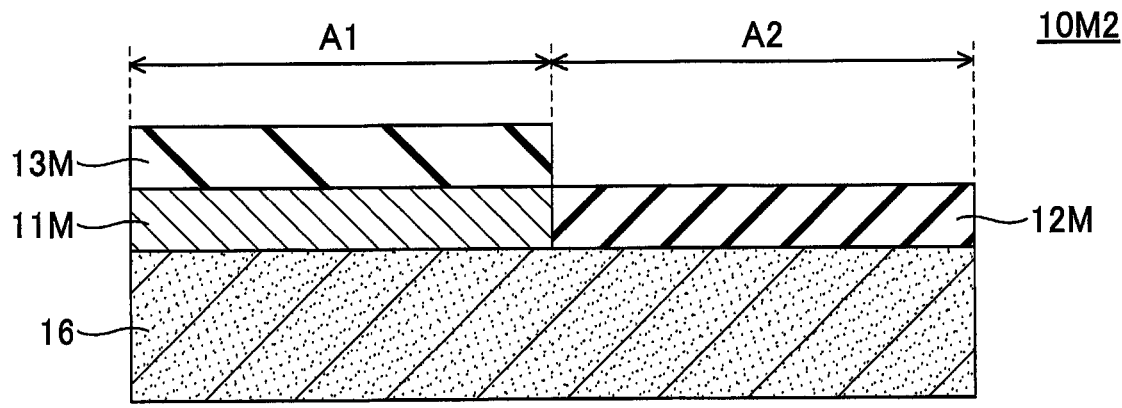
FIG. 11B is a view illustrating an example of a cross-sectional structure of a substrate of the second modification of the embodiment.
Figure 11C:
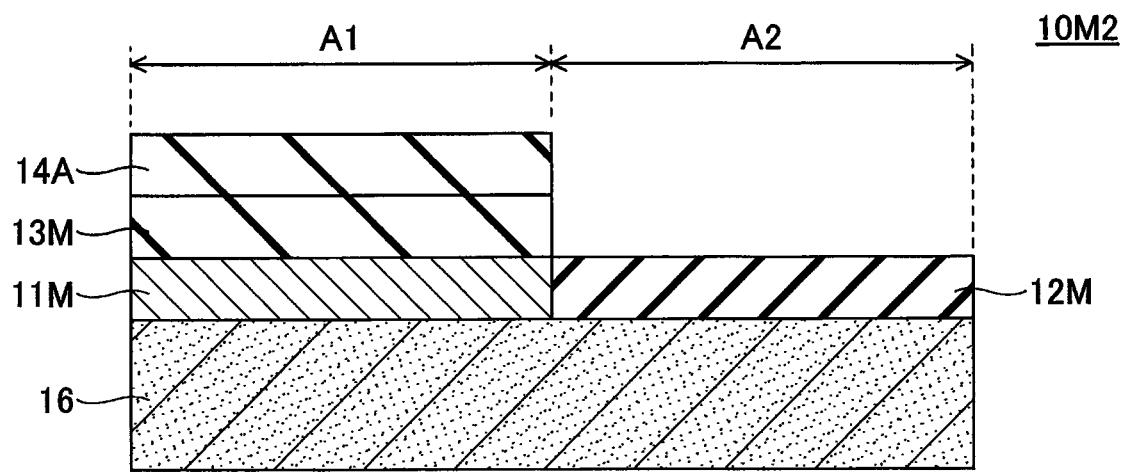
FIG. 11C is a view illustrating an example of a cross-sectional structure of a substrate of the second modification of the embodiment.

Next, a second modification of the embodiment will be described. FIGS. 11A to 11C are views illustrating examples of the cross-sectional structures of a substrate 10M2 of the second modification of the embodiment. FIGS. 11A to 11C illustrate cross-sectional structures in the states corresponding to steps S101, S104, and S106 illustrated in FIG. 1.

In FIG. 11A, the substrate 10M2 is prepared. The substrate 10M2 includes a Cu film 11M, an insulating film 12M, and a base substrate 16. The Cu film 11M may have a natural oxide film formed on the surface thereof, or may be in the state in which the natural oxide film is removed by the surface treatment of step S102 illustrated in FIG. 1. The insulating film 12M is, for example, SiO.

Next, the SAM 13M is adsorbed on the surface of the Cu film 11M in the first region A1. The SAM 13M is, for example, a SAM formed of a raw material gas including a perfluoropolyether group-containing carboxylic acid. The raw material gas of the SAM 13M is the same as the raw material gas for forming the SAM 14 illustrated in FIG. 3B.

Next, a raw material gas containing a perfluoropolyether group-containing carboxylic acid is supplied from above the SAM 13M, and an annealing process is performed to form the SAM 14A on top of the SAM 13M. It is considered that similar to the SAM 14A shown in FIG. 3B, since oxygen of a straight chain of the SAM 13M reacts with a carboxyl group, a molecular structure in which the SAM 14A is introduced into the spaces between the molecules of the SAM 13M is obtained as in the SAMs 13A and 14A illustrated in FIG. 6.

Figure 12:
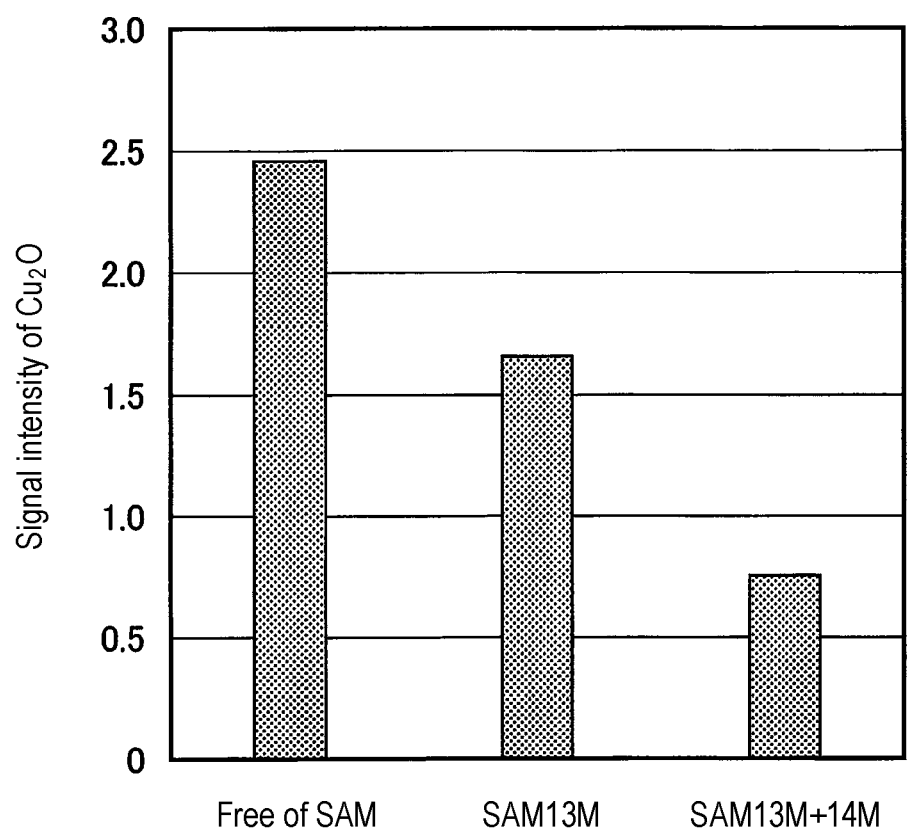
FIG. 12 is a view illustrating a blocking performance.

FIG. 12 is a view showing blocking performance of each of the SAM 13M, and the SAMs 13M and 14A. An annealing process was performed on a substrate 10M2 in which the SAM 13M illustrated in FIG. 11B was formed on the surface of a Cu film 11M and a substrate 10M2 in which the SAMs 13M and 14A illustrated in FIG. 11C were formed on a Cu film 11M, and the degrees of oxidation of the surfaces of the Cu films 11M were compared.

The blocking performance is a performance that suppresses oxidation of the surface of the Cu film 11M in the annealing process in which the base substrate 16 is heated at the temperature of 200 degrees C. for 30 minutes in the atmosphere. For comparison, the annealing process was also performed on a substrate 10M2 in which the Cu film 11M illustrated in FIG. 11A was exposed to the surface of the first region without being covered with any of the SAMs 13M and 14A.

The signal intensities of copper oxides ($Cu_2O$) were measured by a Fourier transform infrared spectrophotometer-reflection absorption method (FTIR-RAS). The signal intensities are standardized values and have no unit.

As shown in FIG. 12, in the Cu film 11M of the substrate 10M2 for the comparison (see FIG. 11A), the signal intensity of copper oxide was about 2.45. In the Cu film 11M covered with a single layer of the SAM 13M of the substrate 10M2 (see FIG. 11B), the signal intensity of copper oxide was about 1.7. In the Cu film 11M covered with the two layers of the SAMs 13M and 14A of the substrate 10M2 (see FIG. 11C), the signal intensity of copper oxide was about 0.75.

As described above, it was found that when the Cu film 11M is covered with the two layers of the SAMs 13M and 14A, it is possible to reduce the degree of oxidation of the surface of the Cu film 11M to about 44% compared with that in the case in which the Cu film 11M is covered with the single layer of the SAM 13M. Furthermore, it was found that it is possible to reduce the degree of oxidation to about 30% compared with that in the case in which the Cu film 11M is exposed.

From such measurement results, it was confirmed that the SAMs 13M and 14A have a high density and a high blocking performance.

Since the above-described SAMs 13M and 14A have high densities, it is possible to selectively form a desired target film 15 on the insulating film 12M of the second region A2.

Therefore, it is possible to provide a film formation method capable of forming a highly dense self-assembled monolayer (the SAMs 13A and 14A).

In addition, since it is possible to form a highly dense self-assembled monolayer, when a target film is formed, the raw material gas of the target film is hindered from reaching the Cu film 11M of the first region A1 through the gaps between the molecules of the SAM 13M and 14A. Thus, it is possible to enhance the selectivity in forming the target film. Therefore, it is possible to provide a film formation method that realizes a semiconductor manufacturing process having a high yield.

In the second modification of the embodiment, the mode in which the SAM 13M is formed with a raw material gas containing a perfluoropolyether group-containing carboxylic acid has been described. However, since the raw material gas for forming the SAM 13M may be any raw material gas capable of forming a SAM on the surface of a Cu film 11M, for example, a raw material including a fluorocarbon group- or alkyl group-containing thiol or phosphonic acid may be used instead of the raw material gas containing a perfluoropolyether group-containing carboxylic acid.

All of steps S102 to S108 other than step S101 of performing wet etching may be performed in the same processing container, or steps S102 to S108 may be divided into multiple groups and processing containers may be divided for respective groups. In addition, all of steps S101 to S108 may be performed in different processing containers of a film formation apparatus. This is useful, for example, when it is desired to independently set processing conditions such as a heating temperature in each step.

<Film Formation System>

Next, a system for carrying out a film formation method according to an embodiment of the present disclosure will be described.

The film formation method according to an embodiment of the present disclosure may be executed in any of a batch apparatus, a single-wafer apparatus, and a semi-batch apparatus. However, the optimum temperature may differ in each of the above steps, and the execution of each step may be hindered when the surface of a substrate is oxidized and thus the surface state is changed. Considering such a point, it is appropriate to use a multi-chamber-type single-wafer film formation system, in which it is easy to set each step to an optimum temperature and to perform all steps in a vacuum.

Hereinafter, this multi-chamber-type single-wafer film formation system will be described.

Figure 13:
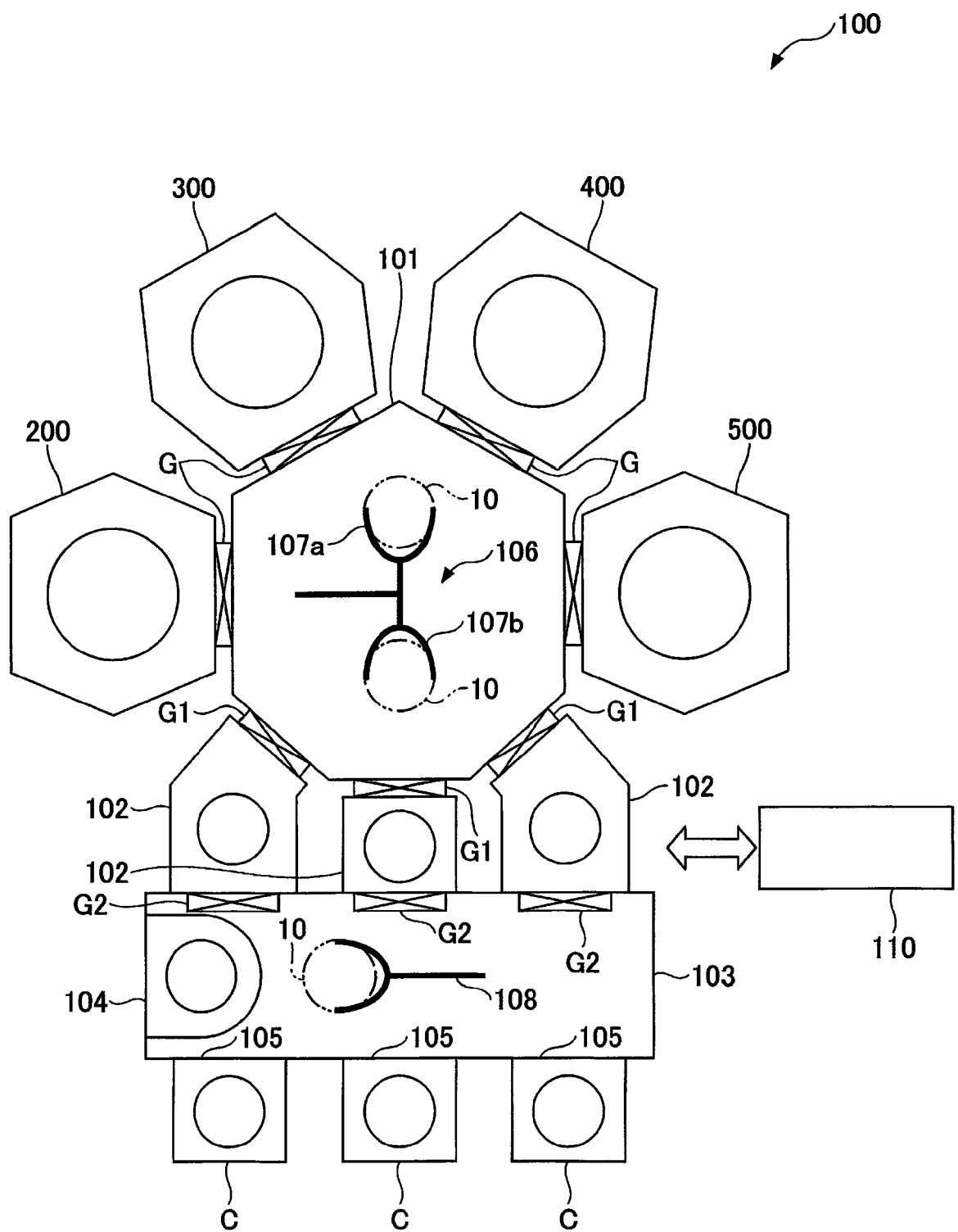
FIG. 13 is a schematic view illustrating an example of a film formation system for executing a film formation method according to an embodiment.

FIG. 13 is a schematic view illustrating an example of a film formation system for executing a film formation method according to an embodiment. Here, unless otherwise specified, a case in which a process is performed on a substrate 10 will be described.

As illustrated in FIG. 13, the film formation system 100 includes an oxidation-reduction treatment apparatus 200, a SAM formation apparatus 300, a film formation apparatus 400, and a plasma processing apparatus 500. These apparatuses are connected to four walls of a vacuum transport chamber 101 having a heptagonal shape in a plan view via gate valves G, respectively. The interior of the vacuum transport chamber 101 is evacuated by a vacuum pump, and is maintained at a predetermined degree of vacuum. That is, the film formation system 100 is a multi-chamber-type vacuum processing system, and is capable of continuously performing the above-described film formation method without breaking the vacuum.

The oxidation-reduction treatment apparatus 200 is, for example, a processing apparatus that performs a reduction process (step S101) on a substrate 10 (see FIG. 2A).

The SAM formation apparatus 300 is an apparatus that selectively forms a SAM 13, 13A, 14, 14A, 14M, or 14MA by steps S102 to S106 by supplying a raw material gas for forming the SAM 13 illustrated in FIG. 2C, the SAM 13A illustrated in FIG. 2D, the SAM 14 illustrated in FIG. 3A, the SAM 14A illustrated in FIG. 3B, the SAM 14M illustrated in FIG. 8A, or the SAM 14MA illustrated in FIG. 8B.

The film formation apparatus 400 is, for example, an apparatus for forming the target film 15 illustrated in FIG. 8D by a CVD method or an ALD method by step S107.

The plasma processing apparatus 500 is, for example, an apparatus for performing a process (step S108) of etching and removing the SAM 13A and the SAM 14A illustrated in FIG. 3C.

Three load-lock chambers 102 are connected to the other three walls of the vacuum transport chamber 101 via gate valves G1, respectively. An atmospheric transport chamber 103 is installed on the side opposite to the vacuum transport chamber 101, with the load-lock chambers 102 interposed therebetween. The three load-lock chambers 102 are connected to the atmospheric transport chamber 103 via gate valves G2, respectively. The load-lock chambers 102 are installed to control pressure between the atmospheric pressure and the vacuum when a substrate 10 is transported between the atmospheric transport chamber 103 and the vacuum transport chamber 101.

The wall of the atmospheric transport chamber 103 opposite to the wall, on which the load-lock chambers 102 are mounted, includes three carrier mounting ports 105 in each of which a carrier C (a FOUP or the like) for accommodating a substrate 10 is installed. In addition, on a side wall of the atmospheric transport chamber 103, an alignment chamber 104 configured to perform alignment of a substrate 10 is installed. The atmospheric transport chamber 103 is configured to form a downflow of clean air therein.

In the vacuum transport chamber 101, a first transport mechanism 106 is installed. The first transport mechanism 106 transports substrates 10 to the oxidation-reduction treatment apparatus 200, the SAM formation apparatus 300, the film formation apparatus 400, the plasma processing apparatus 500, and the load-lock chambers 102. The first transport mechanism 106 has two independently movable transport arms 107a and 107b.

A second transport mechanism 108 is installed in the atmospheric transport chamber 103. The second transport mechanism 108 is configured to transport substrates 10 to the carriers C, the load-lock chambers 102, and the alignment chamber 104.

The film formation system 100 includes an overall controller 110. The overall controller 110 includes a main controller having a CPU (a computer), an input device (a keyboard, a mouse, or the like), an output device (e.g., a printer), a display device (a display or the like), and a storage device (a storage medium). The main controller controls each component or the like of the oxidation-reduction treatment apparatus 200, the SAM formation apparatus 300, the film formation apparatus 400, the plasma processing apparatus 500, the vacuum transport chamber 101, and the load-lock chambers 102. The main controller of the overall controller 110 causes the film formation system 100 to execute operations for executing the film formation method of the embodiment based on, for example, a processing recipe stored in, for example, a storage medium embedded in a storage device or a storage medium set in the storage device. Each device may be provided with a lower-level controller, and the overall controller 110 may be configured as an upper-level controller.

In the film formation system configured as described above, the second transport mechanism 108 takes out a substrate 10 from a carrier C connected to the atmospheric transport chamber 103, and after passing through the alignment chamber 104, the second transport mechanism 108 carries the substrate 10 into one of the load-lock chambers 102. Then, after the interior of the load-lock chamber 102 is evacuated, the first transport mechanism 106 transports the substrate 10 to the oxidation-reduction treatment apparatus 200, the SAM formation apparatus 300, the film formation apparatus 400, and the plasma processing apparatus 500 to perform the film formation process of the embodiment. Then, if necessary, the SAMs 13A and 14A are removed through etching by the plasma processing apparatus 500.

After the above-described processes are completed, the substrate 10 is transported to one of the load-lock chambers 102 by the first transport mechanism 106, and the substrate 10 in the load-lock chamber 102 is returned to the carrier C by the second transport mechanism 108.

By performing the above-described processes simultaneously in parallel on a plurality of substrates 10, selective film formation processes on a predetermined number of substrates 10 are completed.

Since each of these processes is performed by an independent single-wafer apparatus, it is easy to set the optimum temperature for each process, and since it is possible to perform a series of processes without breaking vacuum, it is possible to suppress oxidation during the processes.

Examples of Film Formation Apparatus and SAM Formation Apparatus

Next, examples of an oxidation-reduction treatment apparatus 200, a film formation apparatus, such as the film formation apparatus 400, and a SAM formation apparatus 300 will be described.

Figure 14:
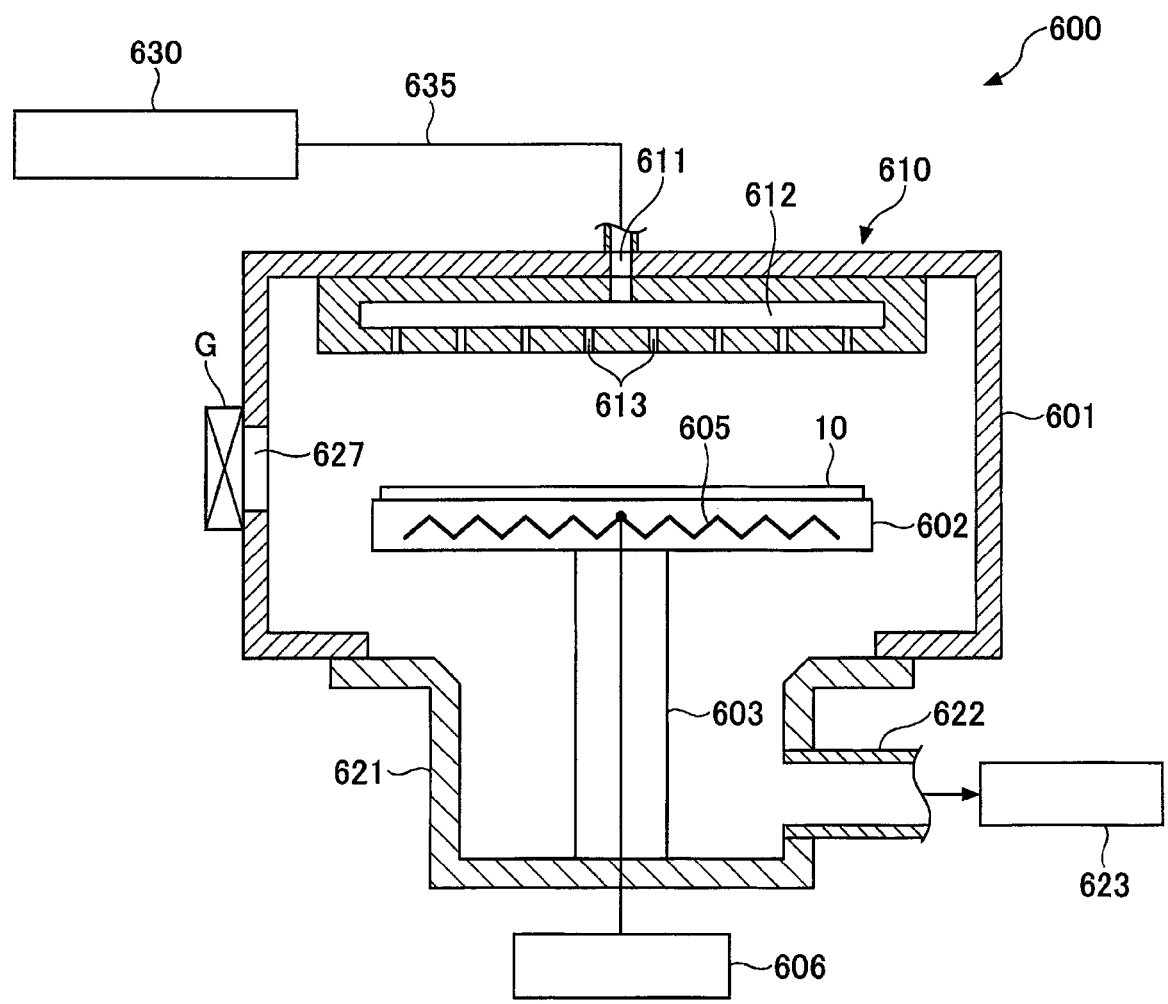
FIG. 14 is a cross-sectional view illustrating an example of a processing apparatus that may be used as a film formation apparatus and a SAM formation apparatus.

FIG. 14 is a cross-sectional view illustrating an example of a processing apparatus that may be used as a film formation apparatus and a SAM formation apparatus.

The oxidation-reduction treatment apparatus 200, the film formation apparatus 400, and the SAM formation apparatus 300 may be configured to have the same configuration. For example, each of these apparatuses may be configured as a processing apparatus 600 illustrated in FIG. 14.

The processing apparatus 600 includes a substantially cylindrical processing container (chamber) 601 configured to be hermetically sealed, and a susceptor 602 configured to horizontally support a substrate 10 thereon is disposed in the processing container 601 and supported by a cylindrical support member 603 provided in the center of the bottom wall of the processing container 601. A heater 605 is embedded in the susceptor 602, and the heater 605 heats the substrate 10 to a predetermined temperature by being fed with power from a heater power supply 606. The susceptor 602 is provided with a plurality of lifting pins (not illustrated) to protrude and retract with respect to the surface of the susceptor 602 so as to support and move the substrate 10 up and down.

A shower head 610 configured to introduce a processing gas for forming a film or a SAM into the processing container 601 in the form of a shower is installed on the ceiling wall of the processing container 601 to face the susceptor 602. The shower head 610 is provided in order to eject a gas supplied from a gas supply mechanism 630, which will be described later, into the processing container 601, and a gas inlet port 611 for introducing gas is formed in the upper portion thereof. A gas diffusion space 612 is formed inside the shower head 610, and a large number of gas ejection holes 613 communicating with the gas diffusion space 612 are formed in the bottom surface of the shower head 610.

The bottom wall of the processing container 601 is provided with an exhaust chamber 621, which protrudes downward. An exhaust pipe 622 is connected to the side surface of the exhaust chamber 621, and an exhaust apparatus 623 including, for example, a vacuum pump and a pressure control valve, is connected to the exhaust pipe 622. By operating the exhaust apparatus 623, the interior of the processing container 601 is configured to be brought into a predetermined depressurized (vacuum) state.

A carry-in/out port 627 for carrying a substrate 10 into/out of the vacuum transport chamber 101 is provided in the side wall of the processing container 601, and the carry-in/out port 627 is opened and closed by a gate valve G.

The gas supply mechanism 630 includes, for example, sources for gases necessary for forming the target film 15 or the SAM 13, an individual pipe for supplying a gas from each source, an opening/closing valve provided in the individual pipe, and a flow rate controller such as a mass flow controller that performs flow rate control of a gas, and further includes a gas supply pipe 635 configured to guide a gas from the individual pipe to the shower head 610 via the gas inlet port 611.

When the processing apparatus 600 performs ALD film formation of the target film 15, the gas supply mechanism 630 supplies a raw material gas and a reaction gas to the shower head 610. In addition, when the processing apparatus 600 forms the SAM 13 or the like, the gas supply mechanism 630 supplies the vapor of a compound for forming the SAM 13 or the like into the processing container 601. The gas supply mechanism 630 is configured to be able to supply an inert gas such as $N_2$ gas or Ar gas as a purge gas or a heat transfer gas as well.

In the processing apparatus 600 configured as described above, the gate valve G is opened, a substrate 10 is carried into the processing container 601 through the carry-in/out port 627, and placed on the susceptor 602. The susceptor 602 is heated to a predetermined temperature by the heater 605, and the inert gas is introduced into the processing container 601. Then, the interior of the processing container 601 is evacuated by the vacuum pump of the exhaust apparatus 623 such that the pressure inside the processing container 601 is adjusted to a predetermined pressure.

Next, when the processing apparatus 600 performs ALD film formation of the target film 15, the raw material gas and the reaction gas are alternately supplied from the gas supply mechanism 630, with purging of the inside of the processing container 601 interposed between the supply of the raw material gas and the supply of the reaction gas. When the processing apparatus 600 forms a SAM 13 or the like, the gas supply mechanism 630 supplies the vapor of an organic compound (raw material) for forming the SAM 13 or the like into the processing container 601.

Although embodiments of the substrate processing method according to the present disclosure have been described above, the present disclosure is not limited to the above-described embodiments or the like. Various changes, modifications, substitutions, additions, deletions, and combinations can be made within the scope of the claims. Of course, these also fall within the technical scope of the present disclosure.

This international application claims priority based on Japanese Patent Application No. 2020-023765 filed with the Japan Patent Office on Feb. 14, 2020, and the entire disclosure of Japanese Patent Application No. 2020-023765 is incorporated herein in its entirety by reference.

EXPLANATION OF REFERENCE NUMERALS

10, 10M1: substrate, 11, 11A: insulating film, 12: a-Si film, 12A: oxide film, 13, 13A, 14, 14A, 14M, 14MA: SAM, 15: target film, 16: base substrate

What is claimed is:
1. A film formation method comprising:
a step of preparing a substrate including a layer of a first material that is formed on a surface in a first region, and a layer of a second material that is formed on a surface in a second region, wherein the second material is different from the first material;
a first SAM formation step of forming a first self-assembled monolayer in the first region by supplying a raw material gas for the first self-assembled monolayer; and
a second SAM formation step for forming a second self-assembled monolayer including an organic acid group or a second self-assembled monolayer including a condensable group on top of the first self-assembled monolayer in the first region by supplying a first gas, which includes an organic acid group, while including a self-assembling molecule, or by supplying a second gas, which includes a condensable group, while including a self-assembling molecule,
wherein, when the first gas is supplied to form the second self-assembled monolayer in the second SAM formation step, the raw material gas for the first self-assembled monolayer is a raw material gas capable of forming, as the first self-assembled monolayer, a self-assembled monolayer containing oxygen in a main chain.

2. The film formation method of claim 1, further comprising:
a step of annealing the substrate by heating the substrate to a temperature of 100 degrees C. to 300 degrees C. after the first SAM formation step and before performing the second SAM formation step.

3. The film formation method of claim 2, wherein, when the first gas is supplied to form the second self-assembled monolayer in the second SAM formation step, the raw material gas for the first self-assembled monolayer is a raw material gas capable of forming, as the first self-assembled monolayer, a self-assembled monolayer containing oxygen in a main chain.

4. The film formation method of claim 3, wherein the raw material gas for the first self-assembled monolayer is a raw material gas including a perfluoropolyether group-containing alkoxysilane.

5. The film formation method of claim 4, wherein the first gas is a raw material gas including a perfluoropolyether group-containing carboxylic acid.

6. A film formation method comprising:
a step of preparing a substrate including a layer of a first material that is formed on a surface in a first region, and a layer of a second material that is formed on a surface in a second region, wherein the second material is different from the first material;
a first SAM formation step of forming a first self-assembled monolayer in the first region by supplying a raw material gas for the first self-assembled monolayer;
a second SAM formation step for forming a second self-assembled monolayer including an organic acid group or a second self-assembled monolayer including a condensable group on top of the first self-assembled monolayer in the first region by supplying a first gas, which includes an organic acid group, while including a self-assembling molecule, or by supplying a second gas, which includes a condensable group, while including a self-assembling molecule;
a film formation step of forming a target film in the second region after the second SAM formation step; and
a SAM removing step of removing the first self-assembled monolayer and the second self-assembled monolayer after the film formation step of forming the target film.

7. The film formation method of claim 3, wherein the raw material gas for the first self-assembled monolayer is a raw material gas including a perfluoropolyether group-containing halosilane.

8. The film formation method of claim 3, wherein the raw material gas for the first self-assembled monolayer is a raw material gas including a perfluoropolyether group-containing carboxylic acid, or a raw material gas including a fluorocarbon group- or alkyl group-containing thiol.

9. A film formation method comprising:
- a step of preparing a substrate including a layer of a first material that is formed on a surface in a first region, and a layer of a second material that is formed on a surface in a second region, wherein the second material is different from the first material;
- a first SAM formation step of forming a first self-assembled monolayer in the first region by supplying a raw material gas for the first self-assembled monolayer; and
- a second SAM formation step for forming a second self-assembled monolayer including an organic acid group or a second self-assembled monolayer including a condensable group on top of the first self-assembled monolayer in the first region by supplying a first gas, which includes an organic acid group, while including a self-assembling molecule, or by supplying a second gas, which includes a condensable group, while including a self-assembling molecule, wherein, when the second gas is supplied to form the second self-assembled monolayer in the second SAM formation step, the raw material gas for the first self-assembled monolayer is a raw material gas including a perfluoropolyether group-containing alkoxysilane or a perfluoropolyether group-containing halosilane.

10. The film formation method of claim 9, wherein the second gas is a raw material gas including a perfluoropolyether group-containing alkoxysilane or a perfluoropolyether group-containing halosilane.

11. The film formation method of claim 1, further comprising:
- a film formation step of forming a target film in the second region after the second SAM formation step.

* * * * *